United States Patent
Hidaka

(10) Patent No.: US 6,529,404 B2
(45) Date of Patent: Mar. 4, 2003

(54) THIN FILM MAGNETIC MEMORY DEVICE CAPABLE OF REDUCING NUMBER OF WIRES AND READING DATA AT HIGH SPEED

(75) Inventor: Hideto Hidaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/834,638

(22) Filed: Apr. 16, 2001

(65) Prior Publication Data

US 2002/0036918 A1 Mar. 28, 2002

(30) Foreign Application Priority Data

Sep. 25, 2000 (JP) .......................... 2000-290110
Dec. 7, 2000 (JP) .......................... 2000-372510

(51) Int. Cl.$^7$ .............................................. G11C 11/14
(52) U.S. Cl. .................... 365/171; 365/173; 365/148
(58) Field of Search ................................ 365/171, 173, 365/97, 148, 104

(56) References Cited

U.S. PATENT DOCUMENTS

| | | | |
|---|---|---|---|
| 5,640,343 A | | 6/1997 | Gallagher et al. |
| 5,650,958 A | | 7/1997 | Gallagher et al. |
| 5,677,637 A | * | 10/1997 | Nakazato et al. ............. 326/35 |
| 5,734,605 A | | 3/1998 | Zhu et al. |
| 5,835,314 A | | 11/1998 | Moodera et al. |
| 5,946,227 A | * | 8/1999 | Naji ........................ 365/158 |
| 5,952,692 A | * | 9/1999 | Nakazato et al. ........... 257/321 |
| 6,034,887 A | * | 3/2000 | Gupta et al. ................ 365/171 |
| 6,191,972 B1 | * | 2/2001 | Miura et al. ................ 365/171 |
| 2002/0080641 A1 | * | 6/2002 | Asao et al. .................... 365/63 |
| 2002/0080644 A1 | * | 6/2002 | Ito .............................. 365/158 |
| 2002/0126524 A1 | * | 9/2002 | Sugibayashi et al. ....... 365/158 |
| 2002/0136053 A1 | * | 9/2002 | Asano et al. ................ 365/158 |

FOREIGN PATENT DOCUMENTS

JP 11-110961 4/1999

OTHER PUBLICATIONS

Roy Scheuerlein, William Gallagher, Stuart Parkin, Alex Lee, Sam Ray, Ray Robertazzi, and Williiam Reoher, "A 10ns Read and Write Non–Volatile Memory Array Using a Magnetic Tunnel Junction and Fet Switch in Each Cell," ISSCC Digest of Technical Papers, TA7.2, Feb. 2000, pp. 128, 129, 94, 95, 409, & 410.

M. Durlam, P. Naji, M. Deherrera, S. Tehrani, G. Kerszykowski, and K. Kyler, "Nonvolatile Ram Based on Magnetic Tunnel Junction Elements," ISSCC Digest of Technical Papers TA7.3, Feb. 2000. pp. 130, 131, 96. 97, 410, & 411.

Co–pending U.S. application Ser. No. 09/832,025, filed Apr. 11, 2002.

* cited by examiner

Primary Examiner—Hoai Ho
Assistant Examiner—Thong Le
(74) Attorney, Agent, or Firm—McDermott, Will & Emery

(57) ABSTRACT

An MTJ memory cell includes a magnetic tunnel junction part having a resistance value varying with the level of stored data and an access transistor. The gate of the access transistor is connected with a read word line. A bit line is not directly connected with the magnetic tunnel junction part but electrically connected with the magnetic tunnel junction part through the access transistor. The magnetic tunnel junction part is connected between a write word line and the access transistor. In data reading, the voltage of the write word line is set to a ground voltage, for forming a current path for the data reading.

17 Claims, 18 Drawing Sheets

THIN FILM MAGNETIC MEMORY DEVICE CAPABLE OF REDUCING NUMBER OF WIRES AND READING DATA AT HIGH SPEED

BACKGROUND OF THE INVENTION

1. Field of the Invention

The present invention relates to a thin film magnetic memory device, and more specifically, it relates to a random access memory comprising a memory cell having a magnetic tunnel junction (MTJ).

2. Description of the Prior Art

An MRAM (magnetic random access memory) device is watched with interest as a memory device capable of storing data in a nonvolatile manner with small power consumption. The MRAM device, storing data in a nonvolatile manner with a plurality of thin film magnetic elements formed in a semiconductor integrated circuit, is capable of making random access to each of the thin film magnetic elements.

In particular, it has recently been reported that the performance of an MRAM device is remarkably progressed by employing thin film magnetic elements utilizing magnetic tunnel junctions (MTJ) as memory cells. An MRAM device comprising memory cells having magnetic tunnel junctions is disclosed in technical literature such as "A 10 ns Read and Write Non-Volatile Memory Array Using a Magnetic Tunnel Junction and FET Switch in each Cell", ISSCC Digest of Technical Papers, TA7.2, Feb. 2000, "Nonvolatile RAM based on Magnetic Tunnel Junction Elements", ISSCC Digest of Technical Papers, TA7.3, Feb. 2000 or the like.

FIG. 23 is a schematic diagram showing the structure of a memory cell (hereinafter also simply referred to as "MTJ memory cell") having a magnetic tunnel junction part.

Referring to FIG. 23, the MTJ memory cell includes a magnetic tunnel junction part MTJ having a resistance value varying with the level of stored data and an access transistor ATR. The access transistor ATR is formed by a field-effect transistor, and connected between the magnetic tunnel junction part MTJ and a ground voltage Vss.

A write word line WWL for instructing data writing, a read word line RWL for instructing data reading and a bit line BL which is a data line for transmitting an electric signal corresponding to the level of the stored data in data reading and data writing are arranged for the MTJ memory cell.

FIG. 24 is a conceptual diagram illustrating data read operation from the MTJ memory cell.

Referring to FIG. 24, the magnetic tunnel junction part MTJ has a magnetic layer (hereinafter also simply referred to as "fixed magnetic layer") FL having a fixed field of a constant direction and another magnetic layer (hereinafter also simply referred to as "free magnetic layer") VL having a free field. A tunnel barrier TB formed by an insulator film is arranged between the fixed magnetic layer FL and the free magnetic layer VL. In response to the level of the stored data, either a magnetic field of the same direction as the fixed magnetic layer FL or a magnetic field of a different direction from the fixed magnetic layer FL is written in the free magnetic layer VL in a nonvolatile manner.

In data reading, the access transistor ATR is turned on in response to activation of the read word line RWL. Thus, a sense current Is supplied from a control circuit (not shown) as a constant current flows through a current path along the bit line BL, the magnetic tunnel junction part MTJ, the access transistor ATR and the ground voltage Vss.

The resistance value of the magnetic tunnel junction part MTJ varies with the relation between the field directions of the fixed magnetic layer FL and the free magnetic layer VL. When the field direction of the fixed magnetic layer FL is same to the field direction written in the free magnetic layer VL, the resistance value of the magnetic tunnel junction part MTJ is reduced as compared with the case where the field directions are different from each other.

In data reading, therefore, a voltage drop caused by the sense current Is in the magnetic tunnel junction part MTJ varies with the field direction stored in the free magnetic layer VL. Thus, when starting supplying the sense current Is after temporarily precharging the bit line BL to a high voltage, the level of the data stored in the MTJ memory cell can be read by monitoring change in the voltage level of the bit line BL.

FIG. 25 is a conceptual diagram illustrating data write operation in the MTJ memory cell.

Referring to FIG. 25, the read word line RWL is inactivated and the access transistor ATR is turned off in data writing. In this state, data write currents for writing the magnetic field in the free magnetic layer VL are fed to the write word line WWL and the bit line BL respectively. The field direction of the free magnetic layer VL is decided by the combination of the directions of the data write currents flowing through the write word line WWL and the bit line BL respectively.

FIG. 26 is a conceptual diagram showing the relation between the directions of the data write currents and the field directions in data writing.

Referring to FIG. 26, symbol Hx on the horizontal axis denotes the direction of a magnetic field H(WWL) formed by the data write current flowing through the write word line WWL. Symbol Hy on the vertical axis denotes the direction of a magnetic field H(BL) formed by the data write current flowing through the bit line BL.

The field direction stored in the free magnetic layer VL is newly written only when the sum of the magnetic fields H(WWL) and H(BL) reaches an area outside asteroid characteristic curves shown in FIG. 26. In other words, the field direction stored in the free magnetic layer VL is not updated when a magnetic field corresponding to the area inside the asteroid characteristic curves is applied.

In order to update the data stored in the magnetic tunnel junction part MTJ, therefore, currents must be fed to both of the write word line WWL and the bit line BL. The field direction once stored in the magnetic tunnel junction part MTJ, i.e. the stored data, is held in a nonvolatile manner until new data writing is executed.

Also in data read operation, the sense current Is flows through the bit line BL. However, the sense current Is is generally set to be smaller by one or two orders of magnitude than the aforementioned data write currents, and hence there is a small possibility that the data stored in the MTJ memory cell is erroneously rewritten due to influence by the sense current Is in data reading.

The aforementioned technical literature discloses a technique of integrating such MTJ memory cells on a semiconductor substrate and forming an MRAM device, which is a random access memory.

FIG. 27 is a conceptual diagram showing MTJ memory cells integrated/arranged in rows and columns.

Referring to FIG. 27, a highly integrated MTJ device can be implemented by arranging the MTJ memory cells in rows and columns on a semiconductor substrate. The MTJ memory cells are arranged in n rows by columns (n and m: natural numbers) in FIG. 27.

As described above, the bit line BL, the write word line WWL and the read word line RWL must be arranged for each MTJ memory cell. Therefore, n write word lines WWL1 to WWLn, n read word lines RWL1 to RWLn and m bit lines BL1 to BLm must be arranged for the n by m MTJ memory cells. Thus, independent word lines are generally provided for MTJ memory cells in correspondence to read operation and write operation respectively.

FIG. 28 is a structural diagram of an MTJ memory cell arranged on a semiconductor substrate.

Referring to FIG. 28, an access transistor ATR is formed on a p-type region PAR of a semiconductor main substrate SUB. The access transistor ATR has source/drain regions 110 and 120, which are n-type regions, and a gate 130. The source/drain region 110 is connected with a ground voltage Vss through a metal wire formed on a first metal wiring layer M1. A metal wire formed on a second metal wiring layer M2 is employed for a write word line WWL. A bit line BL is provided on a third metal wiring layer M3.

A magnetic tunnel junction part MTJ is arranged between the second metal wiring layer M2 provided with the write word line WWL and the third metal wiring layer M3 provided with the bit line BL. The source/drain region 120 of the access transistor ATR is electrically connected with the magnetic tunnel junction part MTJ through a metal film 150 formed in a contact hole, the first and second metal wiring layers M1 and M2 and a barrier metal 140. The barrier metal 140 is a buffering member provided for electrically connecting the magnetic tunnel junction part MTJ with the metal wires.

As described above, the read word line RWL and the write word line WWL are provided independently of each other in the MTJ memory cell. The write word line WWL and the bit line BL must be fed with data write currents for generating magnetic fields exceeding a prescribed value in data writing. Therefore, the bit line BL and the write word line WWL are formed by the metal wires.

On the other hand, the read word line RWL, provided for controlling the gate voltage of the access transistor ATR, may not be positively fed with a current. In consideration of improvement in degree of integration, therefore, the read word line RWL is formed by a polysilicon layer or a polycide structure in the same wiring layer as the gate 130 without newly providing an independent metal wiring layer.

Thus, when integrating and arranging MTJ memory cells on a semiconductor substrate, an additional wiling layer must be provided for write word lines for data writing, disadvantageously leading to increase in fabrication cost resulting from complication of processes following increase of the number of metal wires.

Further, a number of MTJ memory cells belonging to the same column are regularly connected to each of the bit lines BL1 to BLm, to disadvantageously increase the capacitances of the bit lines BL1 to BLm. Consequently, it is difficult to increase the speed of data read operation in particular.

SUMMARY OF THE INVENTION

An object of the present invention is to increase the speed of data read operation and reduce the fabrication cost by reducing the number of wiring layers in an MRAM device having MTJ memory cells.

Briefly stated, the present invention is directed to a thin film magnetic memory device comprising a memory array, a plurality of write word lines, a plurality of read word lines and a plurality of data lines. The memory array has a plurality of magnetic memory cells arranged in rows and columns. Each of the plurality of magnetic memory cells includes a storage part having a resistance value varying with the level of stored data written when data write fields applied by first and second data write currents are larger than a prescribed magnetic field, and a memory cell selection gate for passing a data read current through the storage part in data reading. The plurality of write word lines are provided in correspondence to the rows of the magnetic memory cells respectively and selectively activated in response to a result of row selection for feeding the first data write current in data writing. The plurality of read word lines are provided in correspondence to the rows respectively for operating the corresponding memory cell selection gates in response to a result of row selection in the data reading. The plurality of data lines are provided in correspondence to the columns of the magnetic memory cells respectively for feeding the second data write current and the data read current in the data writing and the data reading respectively. Each of the plurality of data lines is electrically connected with the storage parts through the memory cell selection gates in the magnetic memory cells belonging to the corresponding column.

Therefore, a principal advantage of the present invention resides in that only magnetic memory cells corresponding to a row selected as the object of data reading are connected with the data line, whereby the capacitance of the data line can be reduced for performing data reading at a high speed.

A thin film magnetic memory device according to another aspect of the present invention comprises a memory array, a plurality of write word lines, a plurality of read word lines and a plurality of data lines. The memory array has a plurality of magnetic memory cells arranged in rows and columns. Each of the plurality of magnetic memory cells includes a storage part having a resistance value varying with the level of stored data written when data write fields applied by first and second data write currents are larger than a prescribed magnetic field and a memory cell selection gate for passing a data read current through the storage part in data reading. The plurality of write word lines are provided in correspondence to the rows of the magnetic memory cells respectively, and selectively activated in response to a result of row selection for feeding the first data write current in data writing. Each of the plurality of write word lines is electrically connected with the storage parts through the memory cell selection gates in the magnetic memory cells belonging to the corresponding column, and inactivated and set to a prescribed voltage in the data reading. The plurality of read word lines are provided in correspondence to the rows respectively for operating the corresponding memory cell selection gates in response to a result of row selection in the data reading. The plurality of data lines are provided in correspondence to the columns of the magnetic memory cells respectively for feeding the second data write current and the data read current in the data writing and the data reading respectively. The voltage levels of the plurality of data lines are set to a voltage different from the prescribed voltage before execution of the data reading.

Therefore, a path for the data read current can be ensured by connecting the storage parts with the prescribed voltage by the write word lines in data reading, whereby the thin film magnetic memory device can be formed on a semiconductor substrate with a smaller number of metal wiring layers.

A thin film magnetic memory device according to still another aspect of the present invention comprises a memory array, a plurality of write word lines, a plurality of read word lines, a plurality of write data lines and a plurality of read data lines. The memory array has a plurality of magnetic memory cells arranged in rows and columns. Each of the plurality of magnetic memory cells includes a storage part having a resistance value varying with the level of stored data written when data write fields applied by first and second data write currents are larger than a prescribed magnetic field and a memory cell selection gate for passing a data read current through the storage part in data reading. The plurality of write word lines are provided in correspondence to the rows of the magnetic memory cells respectively, and selectively activated in response to a result of row selection for feeding the first data write current in data writing. The plurality of read word lines are provided in correspondence to the rows respectively for operating the corresponding memory cell selection gates in response to a result of row selection in the data reading. The plurality of write data lines are provided in correspondence to the columns of the magnetic memory cells respectively for feeding the second data write current in the data writing. The plurality of read data lines are provided in correspondence to the columns respectively for feeding the data read current in the data reading. Each of the plurality of read data lines is electrically connected with each of the storage parts belonging to the corresponding column through the memory cell selection gate.

Therefore, only the magnetic memory cells corresponding to the row selected as the object of data reading are connected with the read data line in the structure capable of efficiently executing data reading and data writing by independently arranging the read data lines and the write data lines, whereby the capacitances of the read data lines can be reduced for performing data reading at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in detail with reference to the drawings.

First Embodiment

Figure 1:
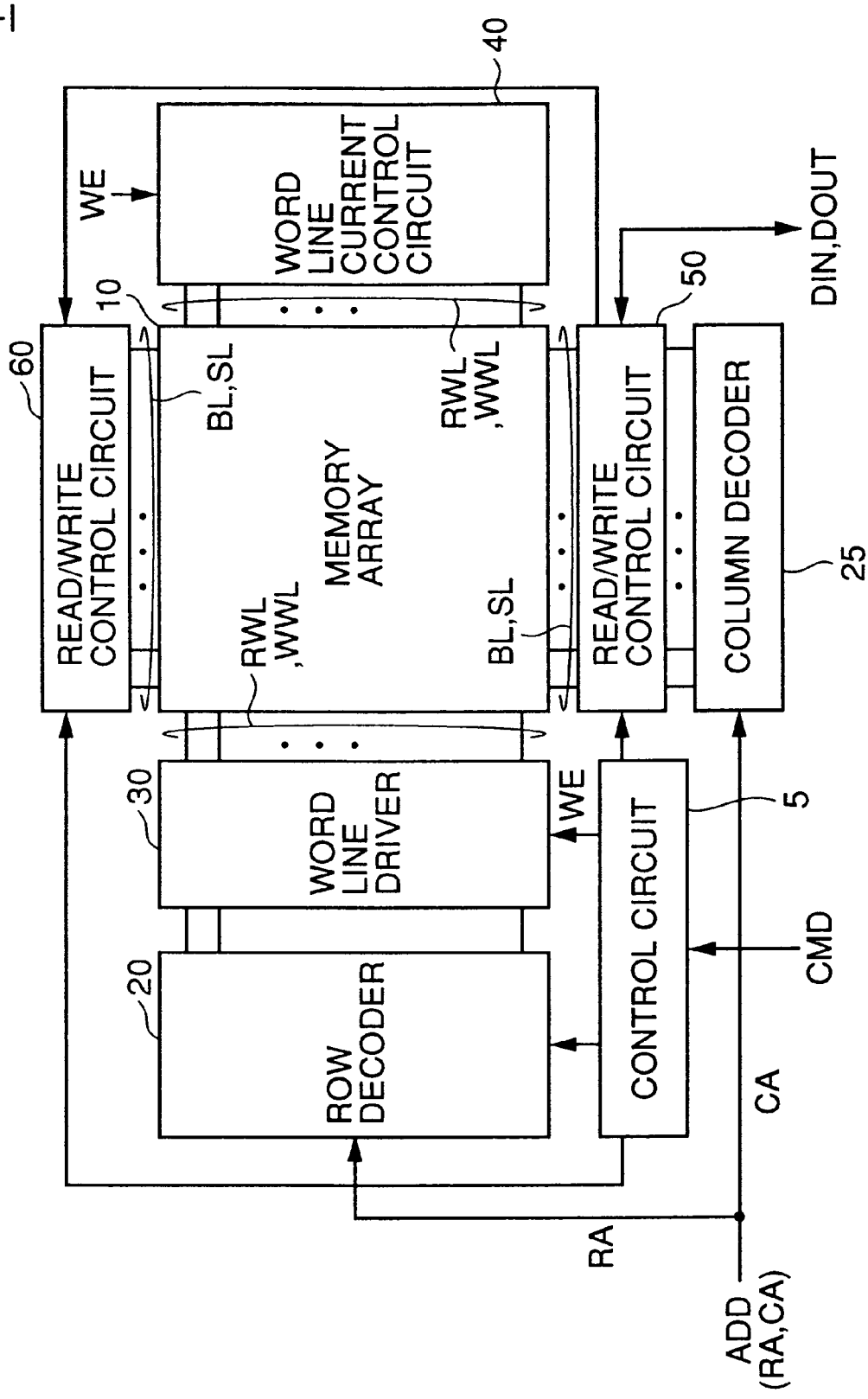
FIG. 1 is a schematic block diagram showing the overall structure of an MRAM device according to a first embodiment of the present invention.

Referring to FIG. 1, an MRAM device 1 according to a first embodiment of the present invention makes random access in response to an external control signal CMD and an address signal ADD, for inputting write data DIN and outputting read data DOUT.

The MRAM device 1 comprises a control circuit 5 controlling the overall operation of the MRAM device 1 in response to the control signal CMD and a memory array 10 having a plurality of MTJ memory cells arranged in n rows by m columns. While the structure of the memory array 10 is described later in detail, a plurality of write word lines WWL and a plurality of read word lines RWL are arranged in correspondence to the rows of the MTJ memory cells respectively, and a plurality of bit lines BL and a plurality of reference lines SL are arranged in correspondence to the columns of the MTJ memory cells respectively.

The MRAM device 1 further comprises a row decoder 20 executing row selection in the memory array 10 in response to a row address RA indicated by the address signal ADD, a column decoder 25 executing column selection in the memory array 10 in response to a column address CA indicated by the address signal ADD, a word line driver 30 for selectively activating the read word lines RWL and the write word lines WWL on the basis of a result of row selection in the row decoder 20, a word line current control circuit 40 for supplying a data write current to the write word lines WWL in data writing and read/write circuits 50 and 60 for supplying a data write current and a sense current (a data read current) in data reading and data writing. The bit line BL corresponds to a data line for feeding the data write current and the sense current to the selected MTJ memory cell.

The read/write control circuits 50 and 60 control the voltage levels of the bit line BL across the memory array 10 and supply the data write current and the sense current for executing data writing and data reading respectively to the bit line BL.

Figure 2:
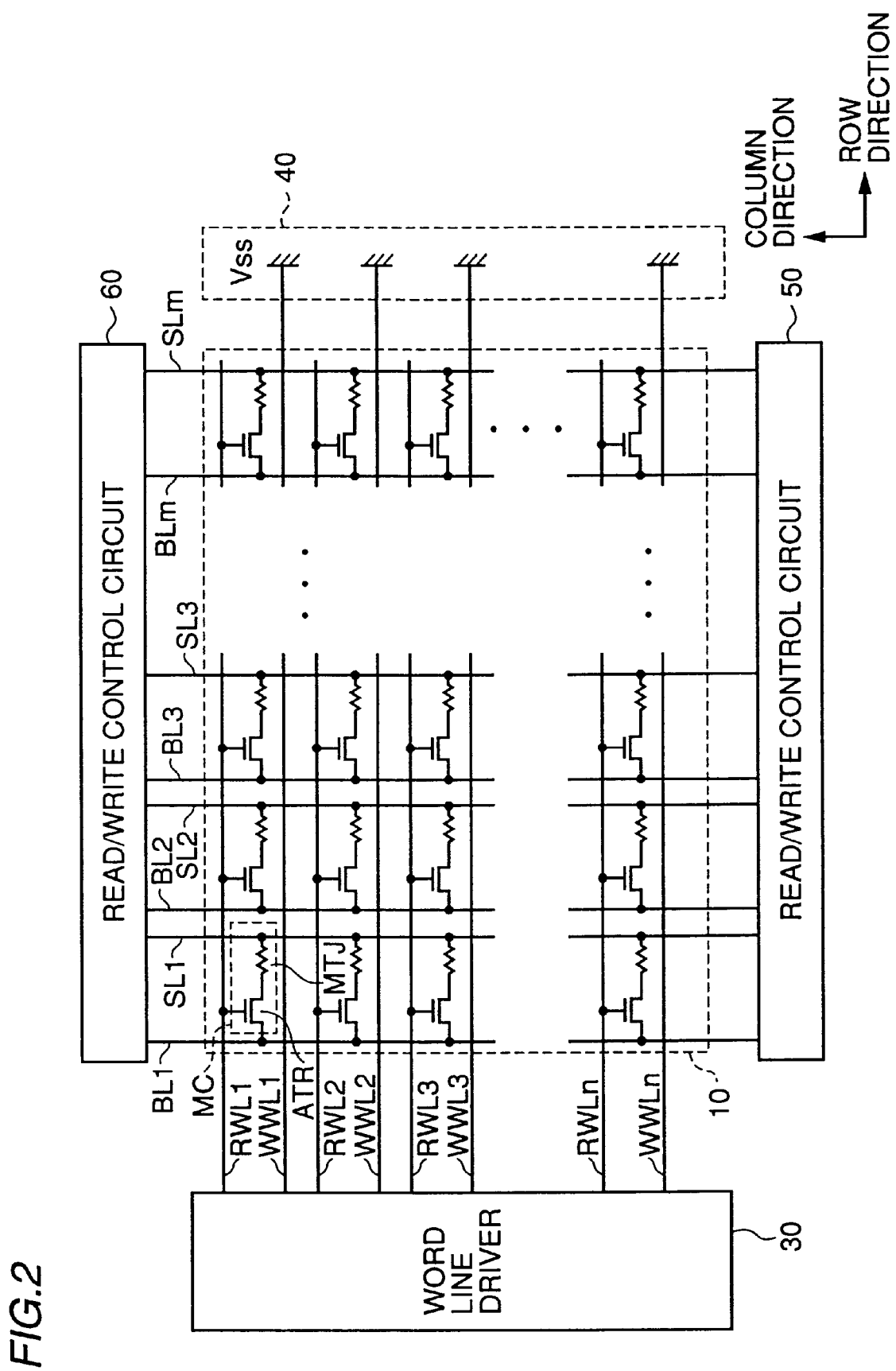
FIG. 2 is a block diagram showing the structure of a memory array according to the first embodiment.

Referring to FIG. 2, the memory array 10 of the structure according to the first embodiment has a plurality of MTJ memory cells MC arranged in n rows by m columns (n and m: natural numbers). In the structure according to the first embodiment, a read word line RWL, a write word line WWL, a bit line BL and a reference line SL are arranged for each MTJ memory cell MC. The read word line RWL and the write word line WWL are arranged along the row direction in correspondence to each row of the memory cells MC. The bit line BL and the reference line SL are arranged along the column direction in correspondence to each column of the memory cells MC.

Consequently, read word lines RWL1 to RWLn, write word lines WWL1 to WWLn, bit lines BL1 to BLm and reference lines SL1 to SLm are provided on the overall memory array 10. Throughout the specification, the write word line, the read word line, the bit line and the reference line are generically denoted by symbols WWL, RWL, BL and SL respectively, while a specific write word line, a specific read word line or a specific bit line is denoted by subscripted symbol such as RWL1, WWL1 or BL1.

The word line current control circuit 40 connects the write word lines WWL1 to WWLn with a ground voltage Vss. Thus, when activating the write word line WWL to a selected state (high level: supply voltage Vcc), a data write current Ip can be fed to the activated write word line WWL.

Figure 3:
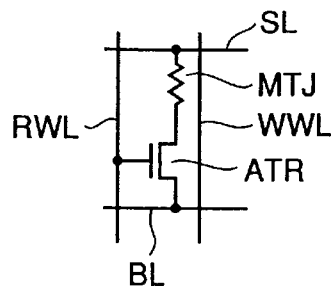
FIG. 3 is a circuit diagram showing the connection mode of an MTJ memory cell according to the first embodiment.

Referring to FIG. 3, the read word line RWL, the write word line WWL, the bit line BL and the reference line SL are provided for each MTJ memory cell formed by a magnetic tunnel junction part MTJ and an access transistor ATR.

The MTJ memory cell includes the magnetic tunnel junction part MTJ and the access transistor ATR serially connected with each other. The magnetic tunnel junction part corresponds to a storage portion having a resistance value with the level of stored data. As described above, a MOS transistor which is a field-effect transistor formed on a semiconductor substrate is representatively applied to the access transistor ATR.

The gate of the access transistor ATR is connected with the read word lines RWL. When the read word line RWL is activated to a selected state (high level: supply voltage Vcc), the access transistor ATR is turned on for electrically connecting the bit line BL and the magnetic tunnel junction part MTJ with each other. When the read word line RWL is inactivated to a non-selected state (low level: ground voltage Vss), the access transistor ATR is turned off for electrically cutting off the bit line BL and the magnetic tunnel junction part MTJ from each other.

The magnetic tunnel junction part MTJ is electrically connected between the reference line SL and the access transistor ATR. When the access transistor ATR is turned on, therefore, a current path is responsively formed through the bit line BL, the access transistor ATR, the magnetic tunnel junction part MTJ and the reference line SL. When a sense current (a data read current) Is is fed to this current path, voltage change responsive to the level of data stored in the magnetic tunnel junction part MTJ takes place on the bit line BL.

The write word line WWL is provided in parallel with the read word line RWL in proximity to the magnetic tunnel junction part MTJ. In data writing, data write currents are fed to the write word line WWL and the bit line BL for rewriting the level of the stored data in the MTJ memory cell by the sum of magnetic fields formed by the data write currents respectively.

Thus, the read word line RWL and the write word line WWL are arranged in parallel with each other. The bit line BL is arranged in a direction intersecting with the read word line RWL and the write word line WWL, and the reference line SL is arranged in parallel with the bit line BL.

Data writing and data reading for the MTJ memory cell according to the first embodiment are now described with reference to FIG. 4.

First, data write operation is described.

In response to a result of row selection in the row decoder 20, the word line driver 30 drives the voltage of the write word line WWL corresponding to the selected row to a selected state (high level). In a non-selected row, the voltage level of the write word line WWL remains in a non-selected state (low level).

In data writing, the read word line RWL is not activated but maintained in a non-selected state (low level). The word line current control circuit 40 connects each write word line WWL with the ground voltage Vss, and hence the data write current Ip is fed to the write word line WWL of the selected row. On the other hand, no current flows to the write word line WWL of the non-selected row.

The read/write control circuits 50 and 60 control the voltages of the bit line BL across the memory array 10, thereby generating data write currents of directions responsive to the levels of written data. When writing data "1", for example, the bit line voltage closer to the read/write circuit 60 is set to a high-voltage state (supply voltage Vcc) while the bit line voltage closer to the opposite read/write control circuit 50 is set to a low-voltage state (ground voltage Vss). Thus, a data write current +Iw flows through the bit line BL from the read/write control circuit 60 toward the read/write control circuit 50. When writing data "0", the bit line voltages closer to the read/write control circuits 50 and 60 are set to a high-voltage state (supply voltage Vcc) and a low-voltage state (ground voltage Vss) respectively, so that a data write current −Iw flows through the bit line BL from the read/write control circuit 50 toward the read/write control circuit 60.

At this time, the data write current ±Iw may not be fed to the respective bit lines but the read/write control circuits 50 and 60 may control the aforementioned voltages of the bit line BL to selectively feed the data write current ±Iw to partial bit lines corresponding to the selected column in response to a result of column selection in the column decoder 25.

The directions of the data write currents Ip and ±Iw are set in the aforementioned manner, for selecting either one of the data write currents +Iw and −Iw of the directions opposite to each other in response to the level "1" or "0" of the written data while fixing the data write current Ip for the write word line WWL to a constant direction regardless of the data level. Consequently, the direction of the data write current Ip flowing through the write word line WWL can be regularly set constant, whereby the structure of the word line current control circuit 40 can be simplified as described above.

Data read operation is now described.

In data reading, the word line driver 30 drives the read word line RWL corresponding to the selected row to a selected state (high level) in response to the result of row selection in the row decoder 20. In a non-selected row, the voltage level of the read word line RWL is maintained in a non-selected state (low level). In data reading, the write word line WWL is not activated but maintained in a non-selected state (low level).

Before the data read operation, the bit line BL is precharged to a high-voltage state (supply voltage Vcc), for example. When data reading is started from this state and the read word line RWL is activated to a high level in the selected row, the corresponding access transistor ATR is turned on.

In the MTJ memory cell, a current path for the sense current Is is responsively formed between the reference line SL connected with the ground voltage Vss and the bit line BL through the access transistor ATR. A voltage drop varying with the level of the stored data of the MTJ memory cell is developed on the bit line BL due to the sense current Is. Assuming that field directions in a fixed magnetic layer FL and a free magnetic layer VL are identical to each other when the level of stored data is "1" in FIG. 4, for example, the bit line BL has a small voltage drop ΔV1 when the stored data is "1" and has a voltage drop ΔV2 larger than the voltage drop ΔV1 when the stored data is "0". The level of the data stored in the MTJ memory cell can be read by detecting the difference between the voltage drops ΔV1 and ΔV2.

The voltage level of the reference line SL is set to the ground voltage Vss in data reading. In data writing, the access transistor ATR is turned off and hence the reference line SL exerts no particular influence on the magnetic tunnel junction part MTJ. Therefore, the voltage level of the reference line SL may be set to the ground voltage Vss similarly to that in data reading. Consequently, the reference line SL may be connected with a node supplying the ground voltage Vss in a region of the read/write control circuit 50 or 60, for example.

Figure 5:
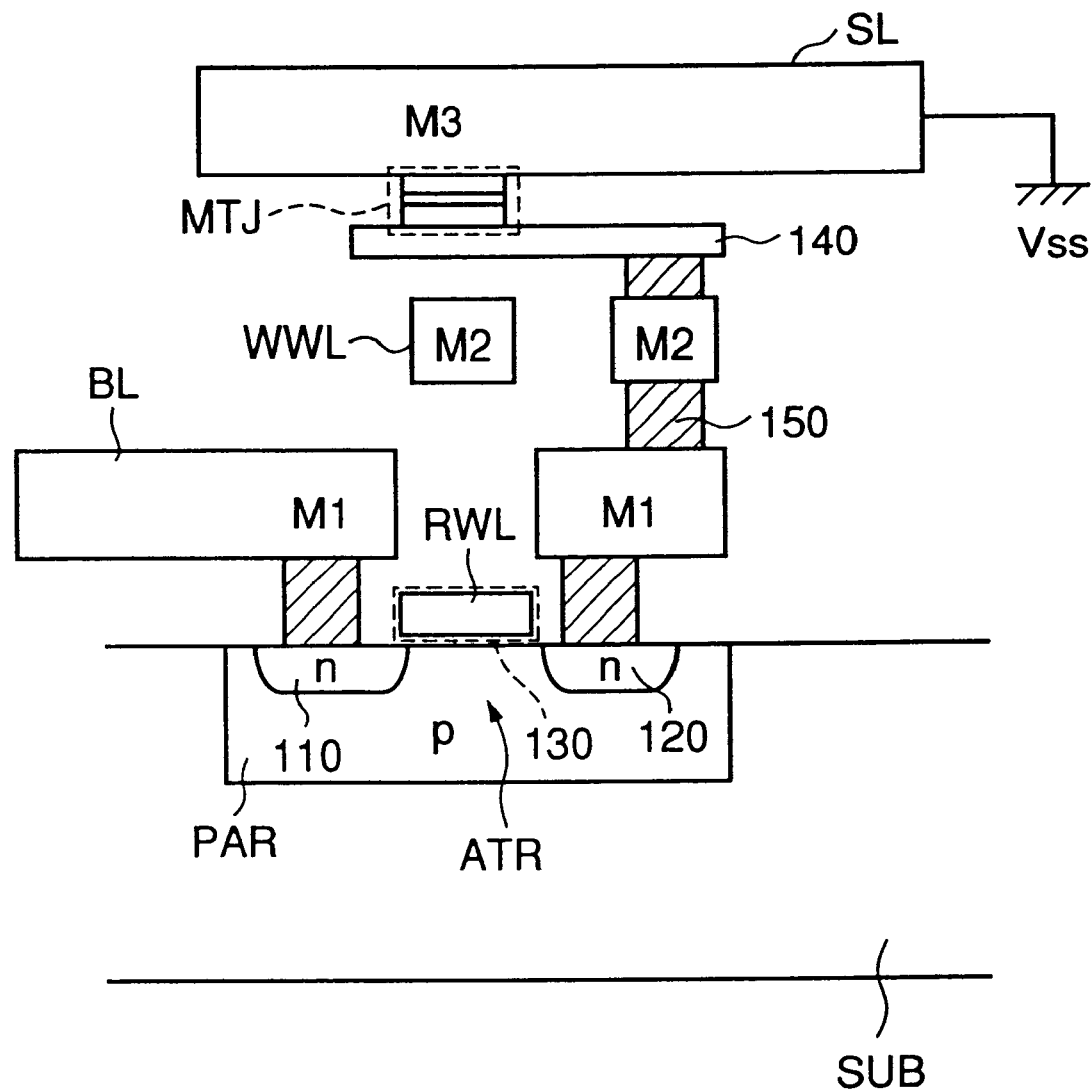
FIG. 5 is a structural diagram illustrating the arrangement of the MTJ memory cell according to the first embodiment.

FIG. 5 shows the arrangement of the MTJ memory cell according to the first embodiment.

Referring to FIG. 5, the access transistor ATR is formed on a p-type region PAR of a semiconductor main substrate SUB. The bit line BL is formed on a first metal wiring layer M1, and electrically connected with a first source/drain region 110 of the access transistor ATR.

A second source/drain region 120 is connected with the magnetic tunnel junction part MTJ through metal wires provided on the first metal wiring layer M1 and a second metal wiring layer M2, a metal film 150 formed in a contact hole and a barrier metal 140. The write word line WWL is provided on the second metal wiring layer M2 in proximity to the magnetic tunnel junction part MTJ. The read word line RWL is arranged on the same layer as a gate 130 of the access transistor ATR.

The reference line SL is arranged on an independent third metal wiring layer M3. The reference line SL is connected with any node, provided on the semiconductor substrate SUB, supplying the ground voltage Vss.

Thus, in the MTJ memory cell, the magnetic tunnel junction part MTJ and the bit line BL are connected with each other not directly but through the access transistor ATR. Therefore, each bit line BL is not directly connected with a number of magnetic tunnel junction parts MTJ belonging to the corresponding memory cell column but electrically connected with only an MTJ memory cell subjected to data reading, i.e., belonging to the memory cell row corresponding to the read word line RWL activated to a selected state (high level). Thus, the capacitance of the bit line BL can be suppressed, for increasing the speed of data reading in particular.

Figure 6:
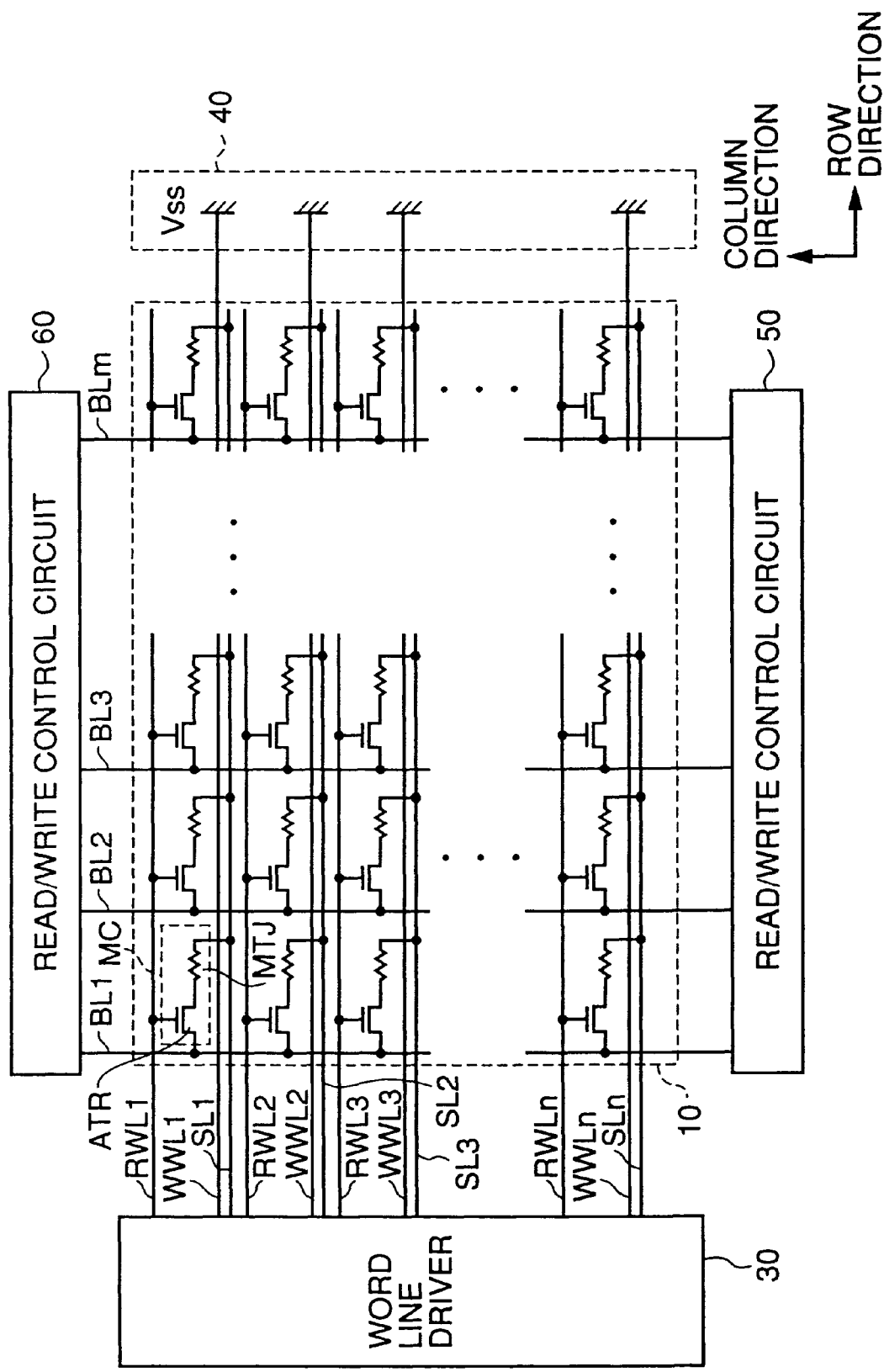
FIG. 6 is a block diagram showing the structure of a memory array according to a modification of the first embodiment.

Modification of First Embodiment Referring to FIG. 6, a memory array 10 according to a modification of the first embodiment is different from the structure shown in FIG. 2 in a point that n reference lines SL1 to SLn are provided in correspondence to memory cell rows. The remaining structure of this modification is similar to that described with reference to FIG. 2, and hence redundant description is not repeated.

Figure 7:
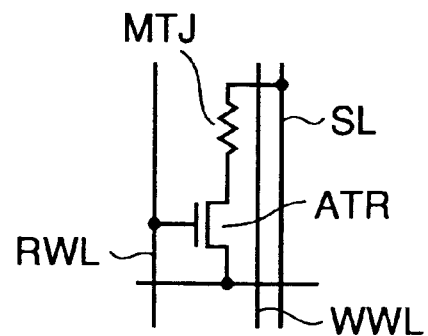
FIG. 7 is a circuit diagram showing the connection mode of an MTJ memory cell according to the modification of the first embodiment.

Referring to FIG. 7, a read word line RWL, a write word line WWL, a bit line BL and a reference line SL are arranged in correspondence to each MTJ memory cell according to the modification of the first embodiment, similarly to the first embodiment. The MTJ memory cell according to the modification of the first embodiment is different in structure from the MTJ memory cell described with reference to FIG. 3 in a point that the reference line SL connected with a magnetic tunnel junction part MTJ is arranged in parallel with the read word line RWL and the write word line WWL.

Figure 8:
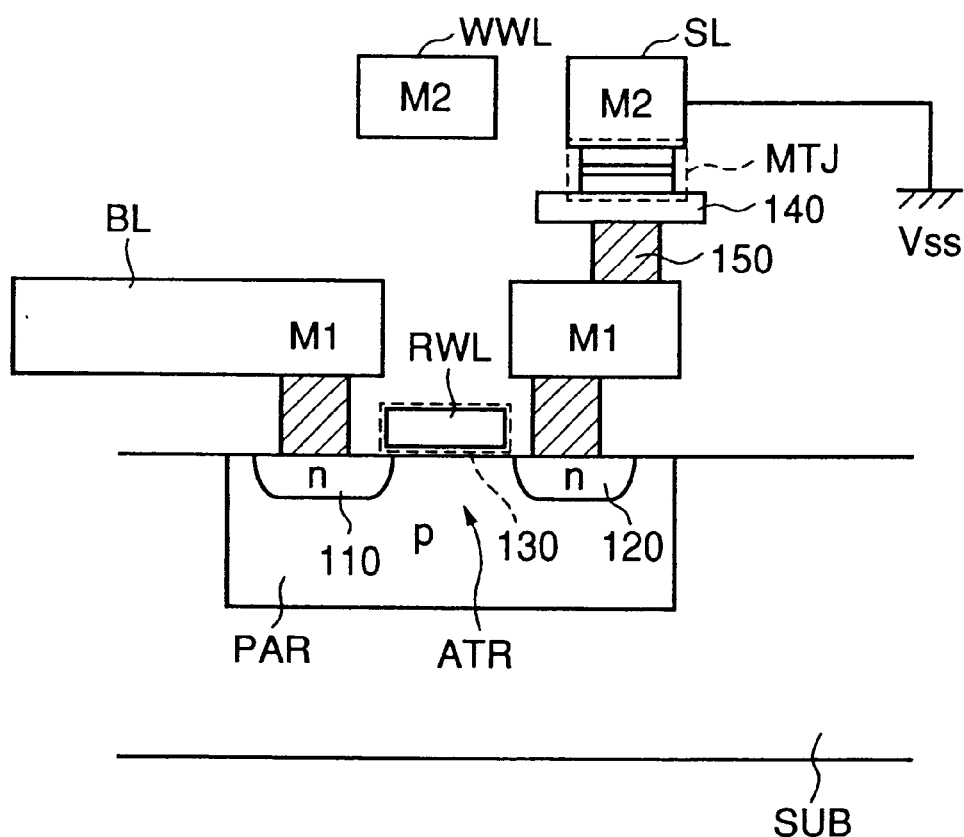
FIG. 8 is a structural diagram illustrating the arrangement of the MTJ memory cell according to the modification of the first embodiment.

Referring to FIG. 8, the bit line BL and the write word line WWL are provided on first and second metal wiring layers M1 and M2 respectively in the MTJ memory cell according to the modification of the first embodiment, similarly to the structure according to the first embodiment described with reference to FIG. 5. In the modification of the first embodiment, the reference line SL connected with the magnetic tunnel junction part MTJ is provided in parallel with the read word line RWL and the write word line WWL, so that the reference line SL can be arranged on the same wiring layer as one of the word lines RWL and WWL. Referring to FIG. 8, the reference line SL is arranged on the second metal wiring layer M2 along with the write word line WWL.

Thus, the reference line SL can be arranged without providing a new metal wiring layer (the third metal wiring layer M3 in FIG. 5) for arranging the reference line SL in the MTJ memory cell according to the modification of the first embodiment. Consequently, the fabrication cost can be further reduced by reducing the number of metal wiring layers, in addition to the effect of increasing the speed of data reading described with reference to the first embodiment.

Figure 4:
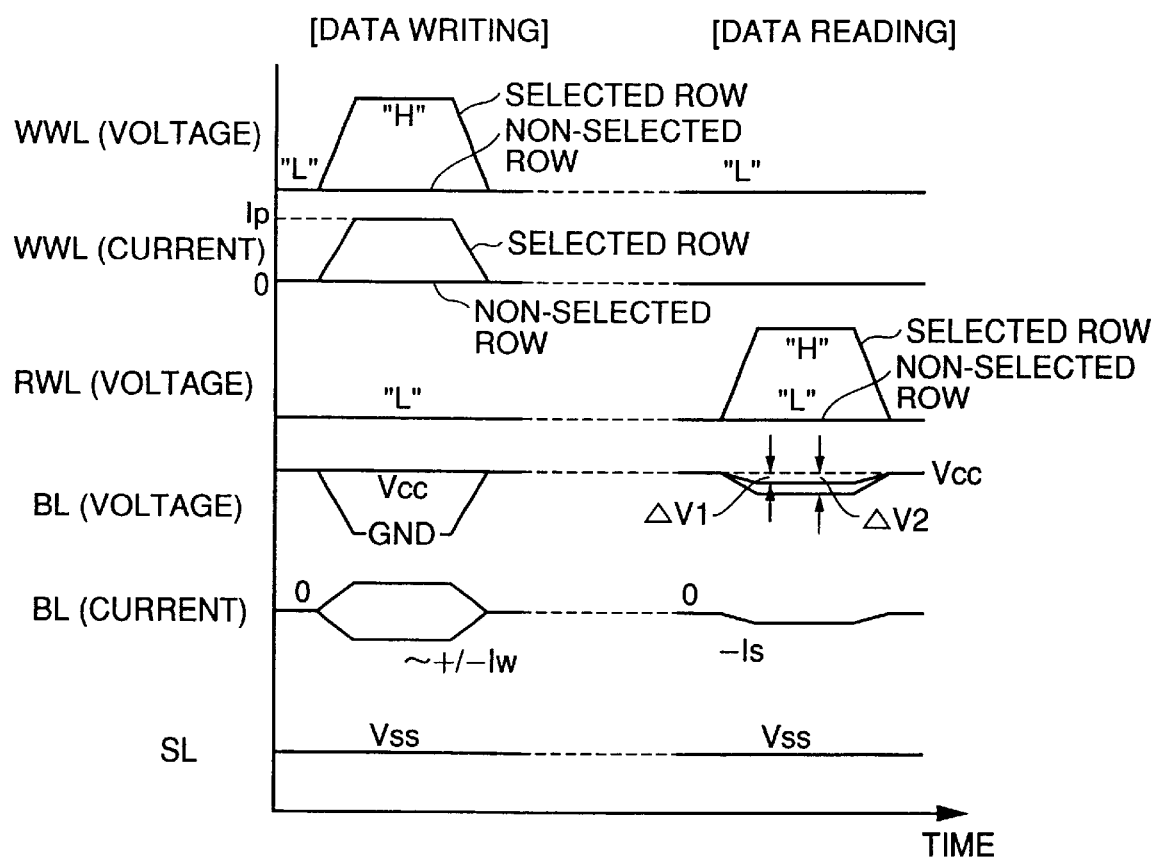
FIG. 4 is a timing chart illustrating data writing and data reading for the MTJ memory cell according to the first embodiment.

The MTJ memory cell according to the modification of the first embodiment is different from the MTJ memory cell according to the first embodiment only in the direction of arrangement of the reference line SL, and hence data read operation and data write operation can be executed by controlling the voltages and currents of the read word line RWL, the write word line WWL, a read bit line RBL and a write bit line WBL similarly to those shown in FIG. 4.

Second Embodiment

Figure 9:
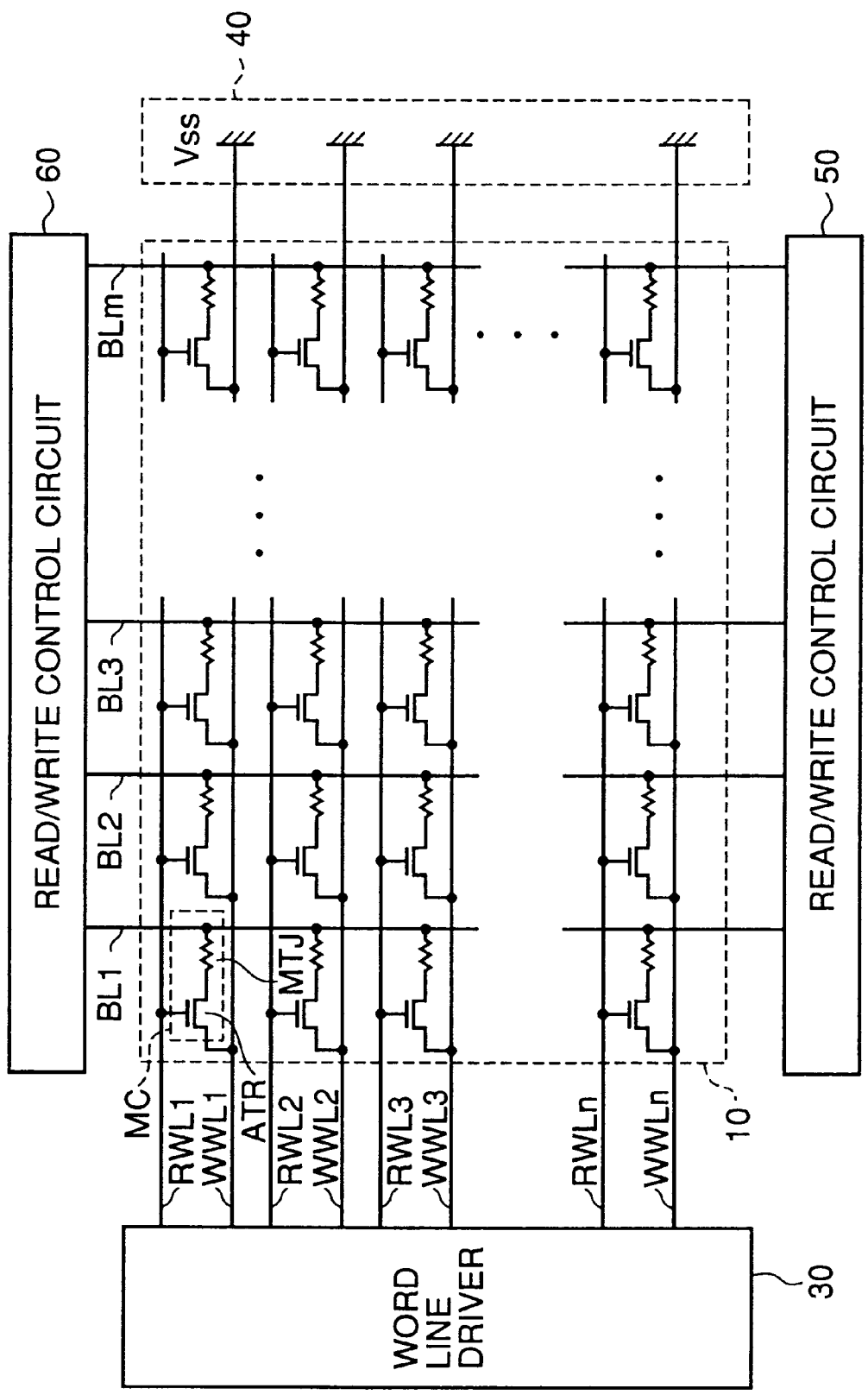
FIG. 9 is a block diagram showing the structure of a memory array according to a second embodiment of the present invention.

Referring to FIG. 9, a memory array 10 according to a second embodiment of the present invention has MTJ memory cells arranged in n rows by m columns. A read word line RWL and a write word line WWL are arranged in correspondence to each memory cell row, and a bit line BL is arranged in correspondence to each memory cell column. Therefore, read word lines RWL1 to RWLn, write word lines WWL1 to WWLn and bit lines BL1 to BLm are arranged on the overall memory array 10. A word line current control circuit 40 connects each write word line WWL with a ground voltage Vss.

According to the second embodiment, the write word line WWL further has the function of a reference line SL connecting a magnetic tunnel junction part MTJ with the ground voltage Vss and ensuring a path for a sense current Is in data reading, thereby attaining reduction of the number of wiring layers.

Figure 10:
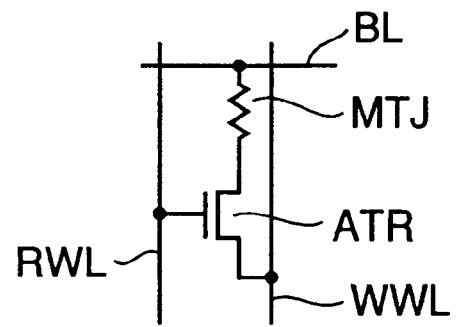
FIG. 10 is a circuit diagram showing the connection mode of an MTJ memory cell according to the second embodiment.

Referring to FIG. 10, an access transistor ATR is electrically connected between the magnetic tunnel junction part MTJ and the write word line WWL in each MTJ memory cell according to the second embodiment. The magnetic tunnel junction part MTJ is connected between the access transistor ATR and the bit line BL. The gate of the access transistor ATR is connected with the read word line RWL.

The write word line WWL is set to the ground voltage Vss in data reading. Thus, when the read word line RWL is activated to a selected state (high level) in data reading, the access transistor ATR is turned on so that a sense current Is can be fed to a path through the bit line BL, the magnetic tunnel junction part MTJ, the access transistor ATR and the write word line WWL.

In data writing, the access transistor ATR is turned off and data write currents are fed to the bit line BL and the write word line WWL, so that magnetic fields corresponding to the level of stored data written in the magnetic tunnel junction part MTJ can be generated.

Figure 11:
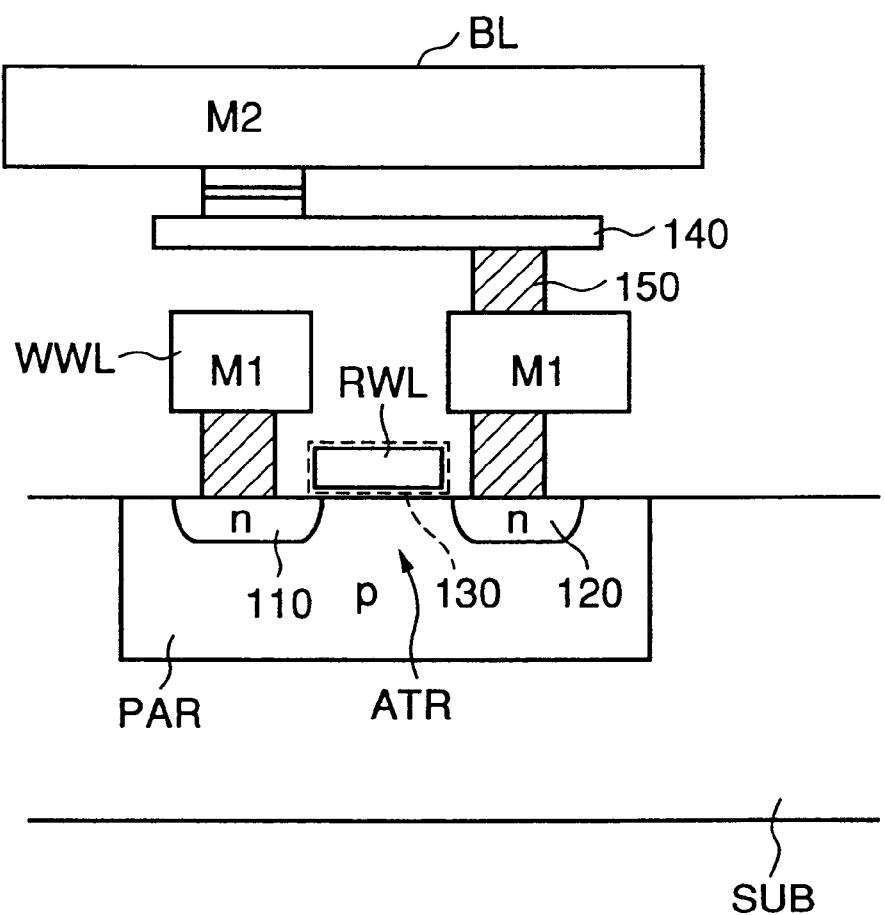
FIG. 11 is a structural diagram illustrating the arrangement of the MTJ memory cell according to the second embodiment.

Referring to FIG. 11, the write word line WWL and the bit line BL are arranged on a first metal wiring layer M1 and a second metal wiring layer M2 respectively in the MTJ memory cell according to the second embodiment. The read word line RWL is arranged on the same layer as a gate 130 of the access transistor ATR.

The write word line WWL is set to the ground voltage Vss in data reading, so that the MTJ memory cell can be arranged through the two metal wiring layers M1 and M2 without providing a reference line SL. Consequently, the fabrication cost can be reduced by reducing the number of metal wiring layers.

Further, the write word line WWL is provided downward beyond the bit line BL, so that these lines WWL and BL can be efficiently electrically connected with the access transistor ATR.

Data read operation and data write operation for the MTJ memory cell according to the second embodiment are now described.

Referring again to FIG. 4, the write word line WWL is maintained in a non-selected state (low level) in data reading. The word line current control circuit 40 connects each word line WWL with the ground voltage Vss, whereby the voltage level of the write word line WWL is at the ground voltage Vss similarly to the voltage level of the reference line SL in data reading. In data writing, no current flows to the reference line SL and no magnetic field is generated for the MTJ memory cell.

Also when omitting the reference line SL, therefore, data read operation and data write operation can be executed on the MTJ memory cell according to the second embodiment by setting the voltages and currents of the write word line WWL, the read word line RWL and the bit line BL similarly to those shown in FIG. 4.

Modification of Second Embodiment

Figure 12:
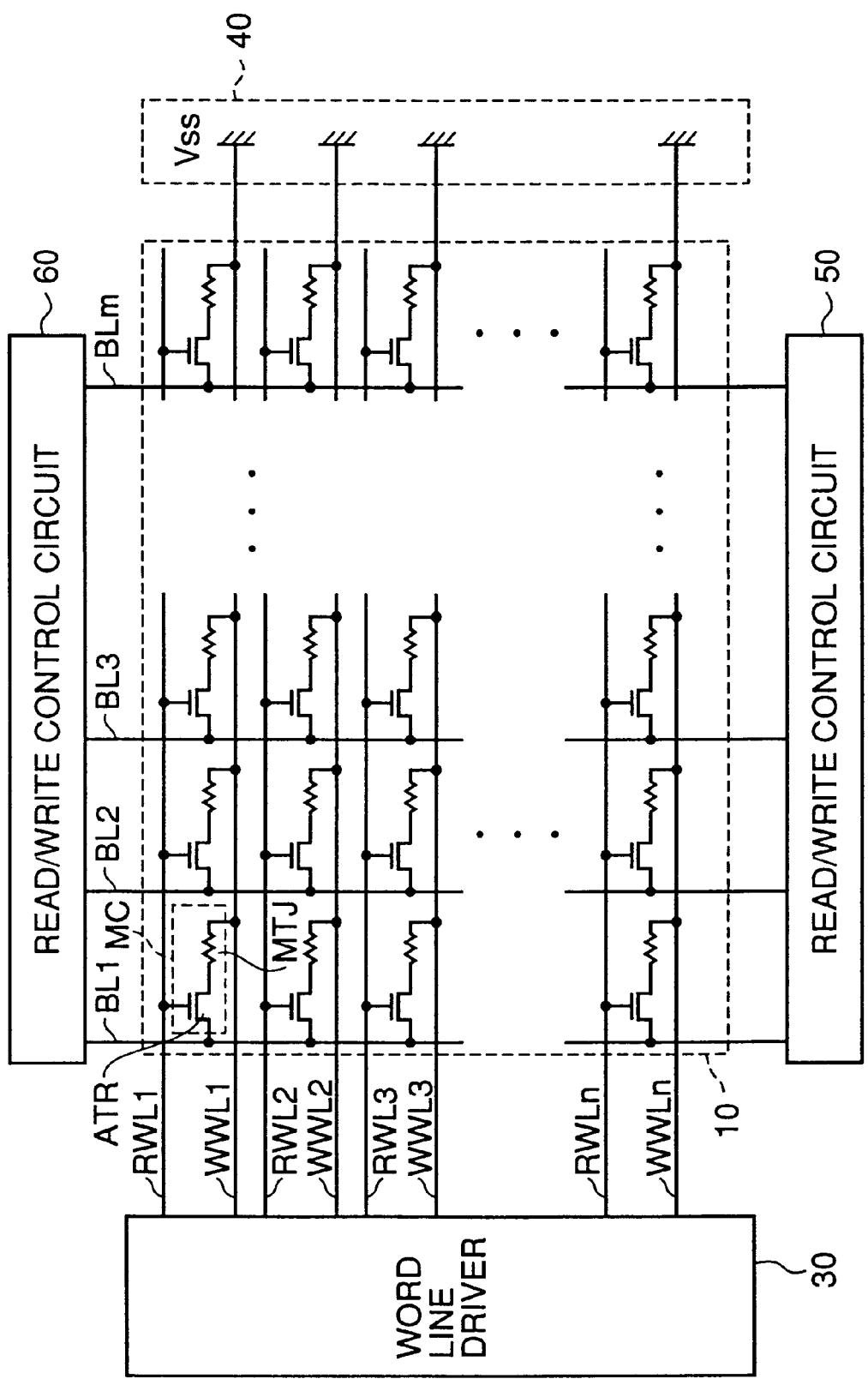
FIG. 12 is a block diagram showing the structure of a memory array according to a modification of the second embodiment.

Referring to FIG. 12, a read word line RWL and a write word line WWL are provided in correspondence to each row of MTJ memory cells arranged in n rows by m columns and a bit line BL is arranged for each column also in a modification of the second embodiment. Therefore, read word lines RWL1 to RWLn, write word lines WWL1 to WWLn and bit lines BL1 to BLm are provided for the overall memory array 10. A word line current control circuit 40 connects each write word line WWL with a ground voltage Vss.

Figure 13:
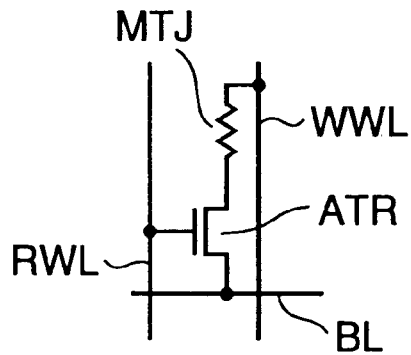
FIG. 13 is a circuit diagram showing the connection mode of an MTJ memory cell according to the modification of the second embodiment.

Referring to FIG. 13, the bit line BL is electrically connected with a magnetic tunnel junction part MTJ through an access transistor ATR in each MTJ memory cell according to the modification of the second embodiment. The magnetic tunnel junction part MTJ is connected between the write word line WWL and the access transistor ATR. The read word line RWL is connected with the gate of the access transistor ATR. The read word line RWL and the write word line WWL are arranged in parallel with each other, and the bit line BL is arranged in a direction intersecting with the word lines RWL and WWL.

Figure 14:
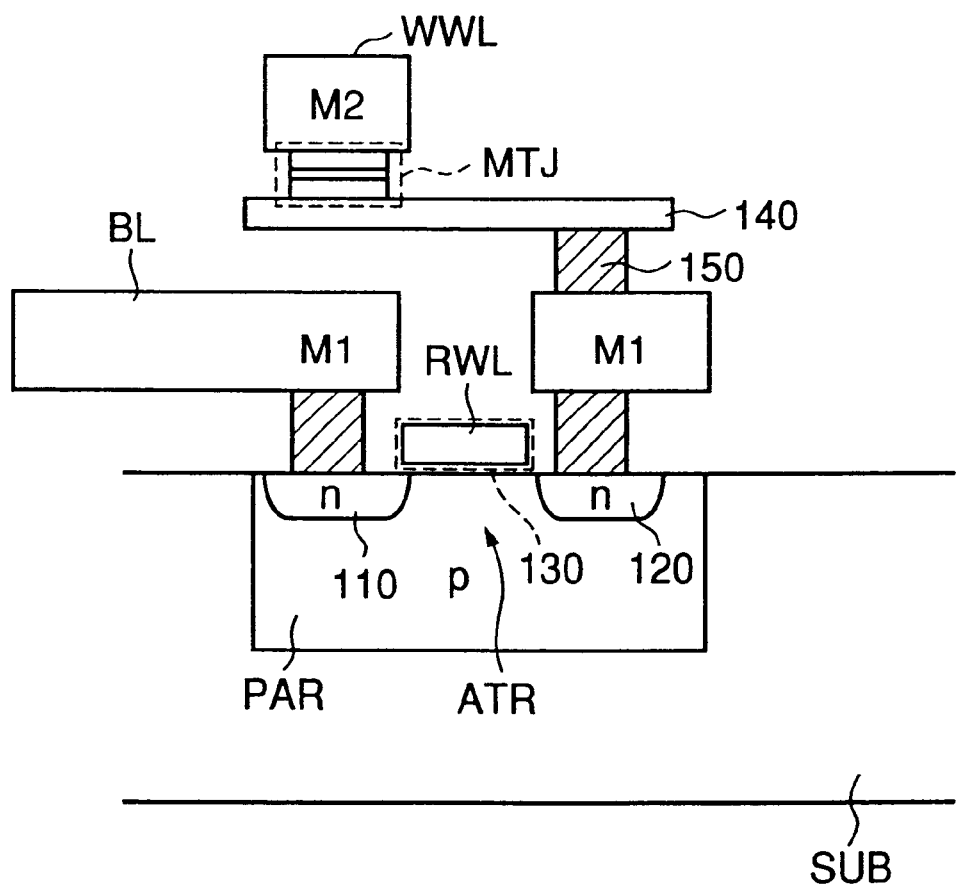
FIG. 14 is a structural diagram illustrating the arrangement of the MTJ memory cell according to the modification of the second embodiment.

Referring to FIG. 14, the bit line BL and the write word line WWL are arranged on a first metal wiling layer M1 and a second metal wiring layer M2 respectively in the MTJ memory cell according to the modification of the second embodiment. The read word line RWL is arranged on the same layer as a gate 130 of the access transistor ATR. The magnetic tunnel junction part MTJ is directly connected with the write word line WWL. Thus, the space between the write word line WWL and the magnetic tunnel junction part MTJ can be reduced, whereby magnetic coupling therebetween can be set large in data writing. Consequently, a data write current Ip flowing through the write word line WWL can be reduced for suppressing occurrence of magnetic noise.

The voltages and currents of the write word line WWL, the read word line RWL and the bit line BL are set similarly to those in the second embodiment in data writing and data reading, and hence redundant description is not repeated. Also in the structure according to the modification of the second embodiment, the MTJ memory cell can be arranged through the two metal wiring layers M1 and M2 while omitting the reference line SL.

The bit line BL is connected with the magnetic tunnel junction part MTJ through the access transistor ATR, whereby each bit line BL is electrically connected with only the MTJ memory cell subjected to data reading, i.e., belonging to the memory cell row corresponding to the read word line RWL activated to a selected state (high level). Consequently, the capacitance of the bit line BL can be suppressed and the speed of data read operation can be increased in particular, similarly to the first embodiment.

Third Embodiment

Figure 15:
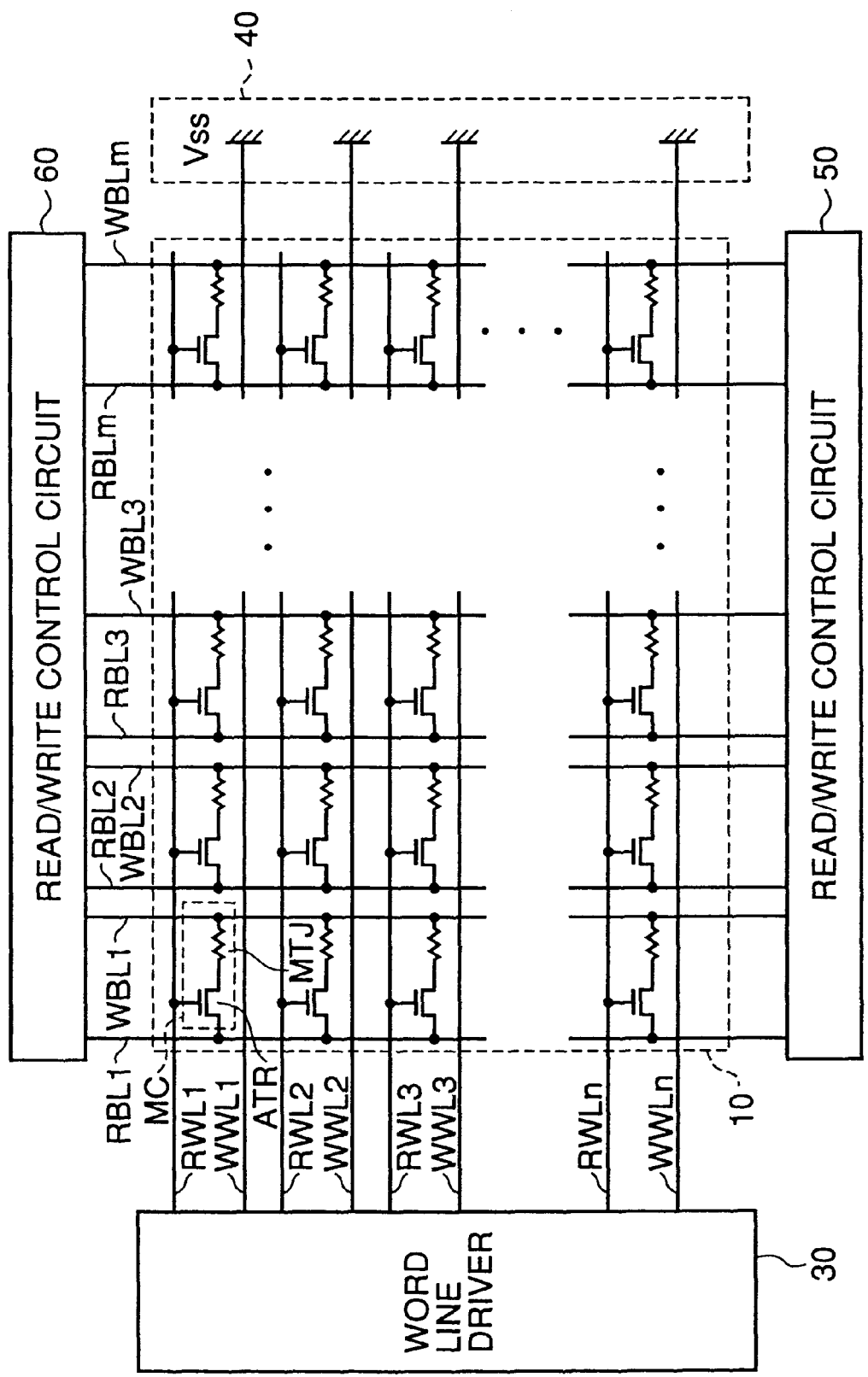
FIG. 15 is a block diagram showing the structure of a memory array according to a third embodiment of the present invention.

Referring to FIG. 15, a read word line RWL and a write word line WWL are provided in correspondence to each row of MTJ memory cells arranged in n rows by m columns in a memory array 10 according to a third embodiment of the present invention. On the other hand, a bit line is divided into a read bit line RBL employed for data reading and a write bit line WBL employed for data writing, which are arranged in correspondence to each memory cell column. The read bit line RBL corresponds to a read data line for feeding the sense current Is (the data read current) in the data read operation. The write bit line WBL corresponds to a write data line for feeding the data write current In in the data write operation. Therefore, read word lines RWL1 to RWLn, write word lines WWL1 to WWLn, read bit lines RBL1 to RBLm and write bit lines WBL1 to WBLm are provided for the overall memory array 10.

The write bit line and the read bit line are also generically denoted by symbols WBL and RBL respectively, while a specific write bit line and a specific read bit line are denoted by subscripted symbols such as WBL1 and RBL1, for example.

A word line current control circuit 40 connects each write word line WWL with a ground voltage Vss. Read/write control circuits 50 and 60 control voltages across the read bit line RBL and the write bit line WBL.

Figure 16:
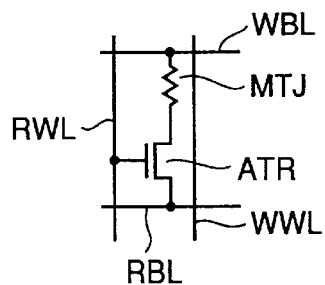
FIG. 16 is a circuit diagram showing the connection mode of an MTJ memory cell according to the third embodiment.

Referring to FIG. 16, an access transistor ATR is electrically connected between a magnetic tunnel junction part MTJ and the read bit line RBL in each MTJ memory cell according to the third embodiment. In other words, the read bit line RBL is electrically connected with the magnetic tunnel junction part MTJ through the access transistor ATR.

The magnetic tunnel junction part MTJ is connected with the access transistor ATR and the write bit line WBL. The read word line RWL and the write word line WWL are provided in directions intersecting with the read bit line RBL and the write bit line WBL respectively. The read word line RWL is connected with the gate of the access transistor ATR.

Figure 17:
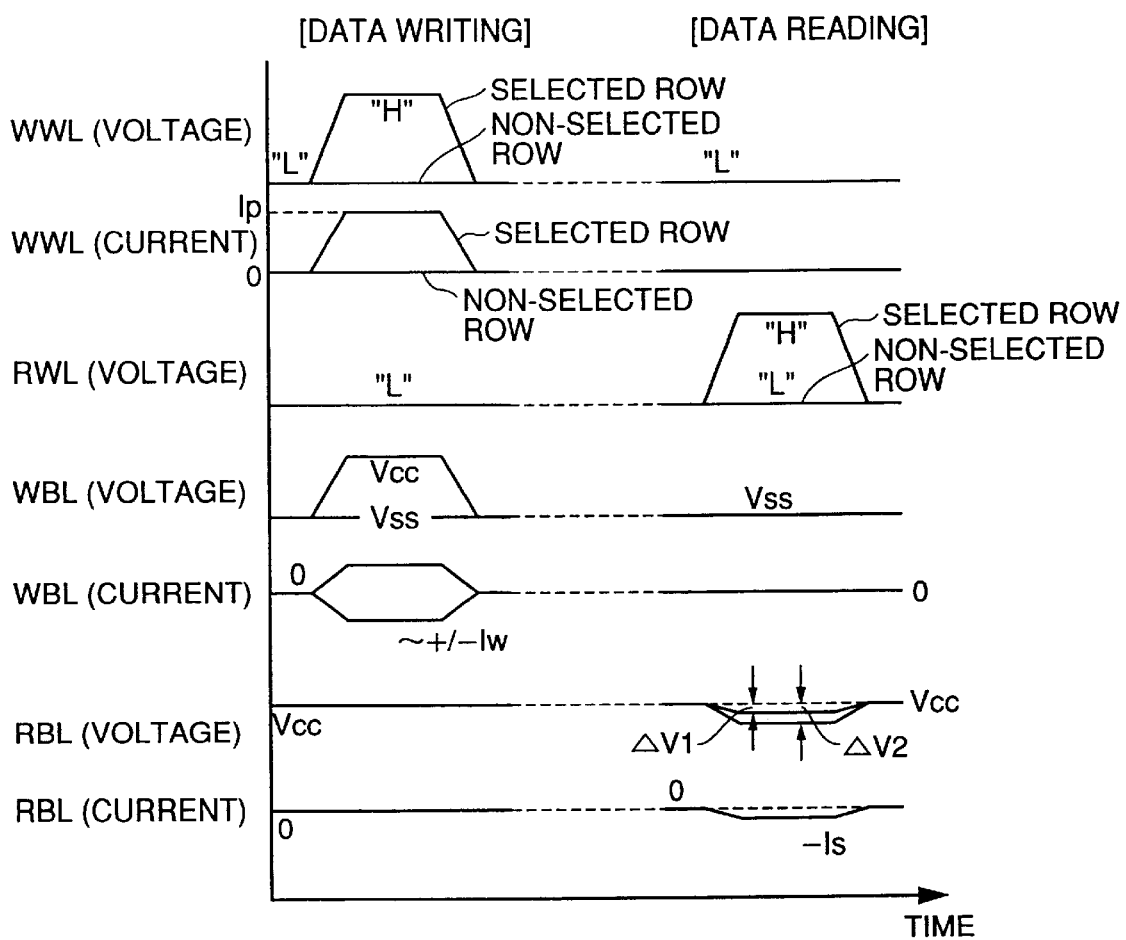
FIG. 17 is a timing chart illustrating first exemplary operation of data writing and data reading for the MTJ memory cell according to the third embodiment.

FIG. 17 shows first exemplary data write operation and data read operation in the MTJ memory cell according to the third embodiment.

The data write operation is first described.

A word line driver 30 drives the voltage of the write word line WWL corresponding to a selected row to a selected state (high level) in response to a result of row selection in a row decoder 20. In a non-selected row, the voltage level of the write word line WWL remains in a non-selected state (low level). The word line current control circuit 40 connects each write word line WWL with the ground voltage Vss, and hence a data write current Ip flows to the write word line WWL in the selected row.

The write bit line WBL is controlled similarly to the voltage of the bit line BL in the data writing described with reference to FIG. 4 from a state precharged to a low level (ground voltage Vss) before data writing. Thus, a data write current ±Iw responsive to the level of written data can be fed to the write bit line WBL. Consequently, data writing can be executed on the MTJ memory cell similarly to the case of FIG. 4.

On the other hand, the read word line RWL is maintained in a non-selected state (low level) in data writing. The read bit line RBL is precharged to a high-voltage state (Vcc). The access transistor ATR is kept turned off, and hence no current flows to the read bit line RBL in data writing.

The data read operation is now described.

In data reading, the write word line WWL is maintained in a non-selected state Now level), and the word line current control circuit 40 fixes the voltage level thereof to the ground voltage Vss.

The word line driver 30 drives the read word line RWL corresponding to a selected row to a selected state (high level) in response to a result of row selection in the row decoder 20. In a non-selected row, the voltage level of the read word line RWL remains in a non-selected state (low level). The read bit line RBL is precharged to a high-voltage state (Vcc) before data reading.

Read/write control circuits 50 and 60 set the write bit line WBL to the ground voltage Vss while supplying a constant quantity of sense current Is for executing data reading to the read bit line RBL in data reading.

The access transistor ATR responsive to activation of the read word line RWL is turned on in this state, thereby forming a current path for the sense current Is in the MTJ memory cell. Consequently, a voltage drop responsive to the stored data appears on the read bit line RBL. Thus, data read operation similar to that shown in FIG. 4 can be executed.

Thus, the voltage of the read bit line RBL in operation, inclusive of data write operation, except data reading is matched with the precharge voltage (supply voltage Vcc in FIG. 17) in data reading, whereby no new precharge operation may be started before data reading. Therefore, the efficiency of the precharge operation can be improved for increasing the speed of data reading.

Similarly, the voltage of the write bit line WBL in operation other than data writing is matched with the voltage (the ground voltage Vss in FIG. 17) set for forming the sense current path in data reading, so that the voltage of the write bit line WBL may not be changed in data reading, whereby the speed of data reading can be increased.

Figure 18:
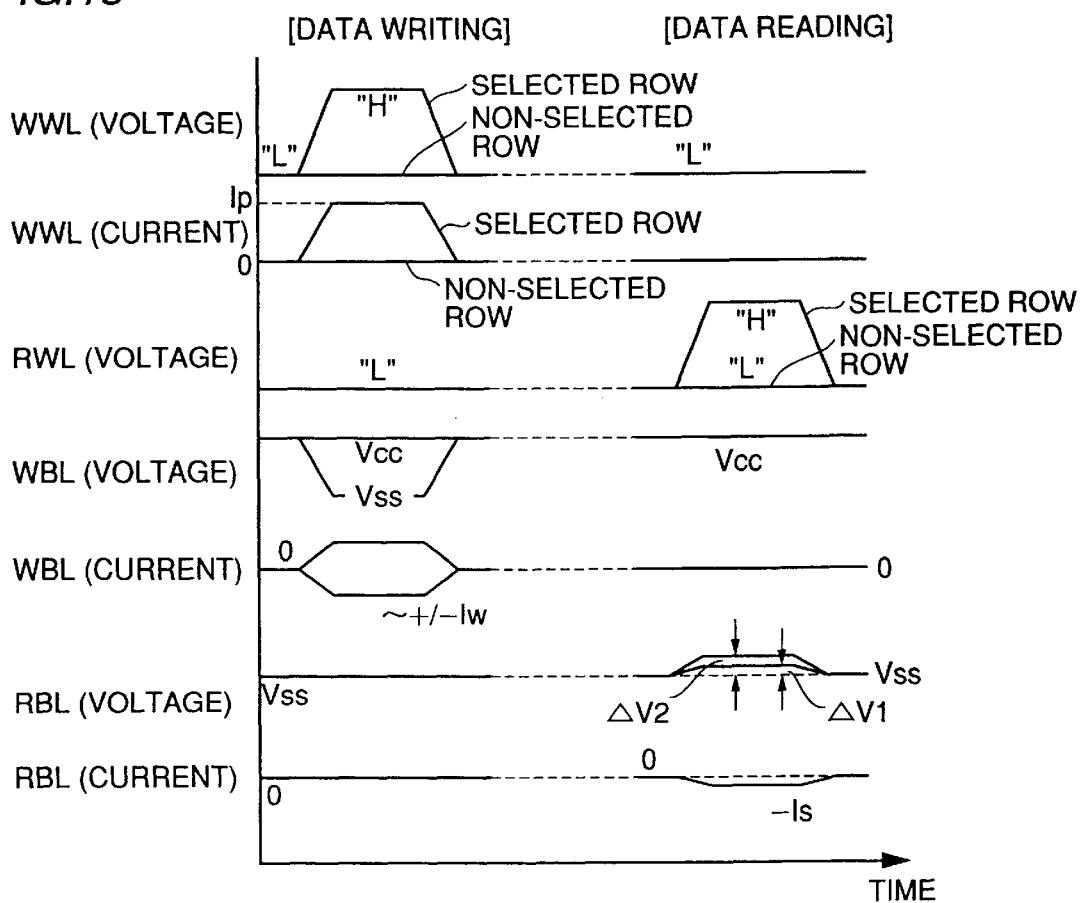
FIG. 18 is a timing chart illustrating second exemplary operation of data writing and data reading for the MTJ memory cell according to the third embodiment.

FIG. 18 shows second exemplary data writing and data reading for the MTJ memory cell according to the third embodiment.

Referring to FIG. 18, the precharge voltage of the read bit line RBL and the voltage of the write bit line WBL in operation other than data writing are set to the ground voltage Vss and the supply voltage Vcc respectively. In other words, the precharge voltage of the read bit line RBL and the voltage of the write bit line WBL in operation other than the data writing are set in place of those shown in FIG. 17.

The voltages and current waveforms of the remaining parts in FIG. 18 are similar to those in FIG. 17, and hence redundant description is not repeated. Also in this case, a current path for the sense current Is can be formed in the MTJ memory cell in response to the ON state of the access transistor ATR in data reading.

Therefore, data read operation and data write operation can be executed while the polarity of voltage change caused in the read bit line RBL in data reading is different from that shown in FIG. 17.

Similarly to the case shown in FIG. 17, precharge operation for the read bit line RBL and voltage change of the write bit line WBL may not be performed before data reading similarly to the case shown in FIG. 17, and hence the speed of data reading can be increased.

Figure 19:
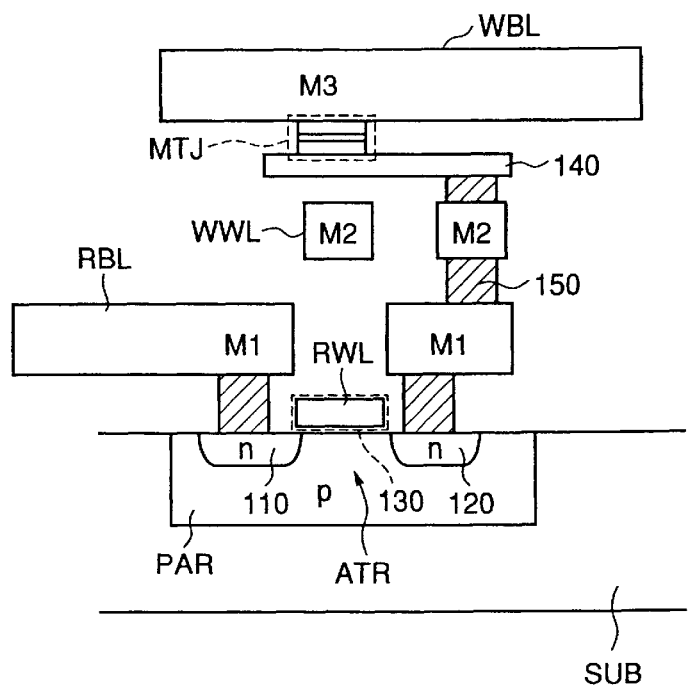
FIG. 19 is a structural diagram showing the arrangement of the MTJ memory cell according to the third embodiment.

Referring to FIG. 19, the read bit line RBL is formed on a first metal wiring layer M1 and connected with a source/drain region 110 of the access transistor ATR in the MTJ memory cell according to the third embodiment. The write word line WWL is arranged on a second metal wiring layer M2. The write bit line WBL is connected with the magnetic tunnel junction part MTJ and formed on a third metal wiring layer M3. The MTJ memory cell is connected with the source/drain region 120 of the access transistor ATR through the first and second metal wiring layers M1 and M2, a metal film 150 and a barrier metal 140.

Thus, the read bit line RBL is not directly connected with the magnetic tunnel junction part MTJ but can be connected only with the magnetic tunnel junction part MTJ of the MTJ memory cell subjected to data reading through the access transistor ATR. Thus, the data read operation can be performed at a high speed by suppressing the capacitance of the read bit line RBL.

The space between the write bit line WBL and the magnetic tunnel junction part MTJ can be reduced, whereby magnetic coupling in data writing can be set large for reducing the value of the data write current ±Iw flowing through the write bit line WBL in data writing. Consequently, magnetic noise can be further suppressed.

Modification of Third Embodiment

Figure 20:
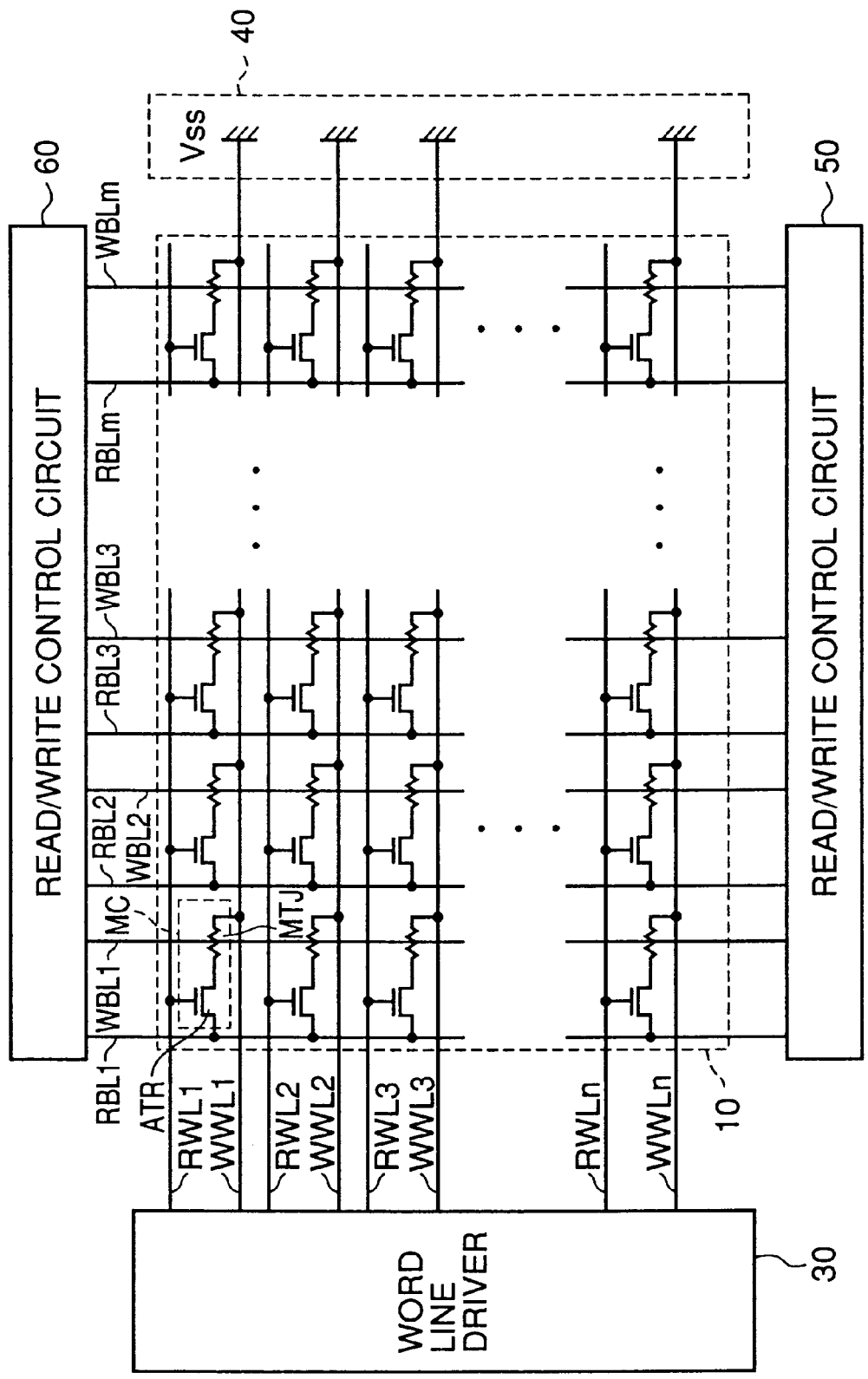
FIG. 20 is a block diagram showing the structure of a memory array according to a modification of the third embodiment.

Referring to FIG. 20, a bit line is divided into a write bit line WBL and a read bit line RBL so that read bit lines RBL1 to RBLm and write bit lines WBL1 to WBLm are arranged in correspondence to respective columns of MTJ memory cells also in a memory array 10 according to a modification of the third embodiment. Read word lines RWL1 to RWLn and write word lines WWL1 to WWLn are arranged in correspondence to rows of the MTJ memory cells respectively. In the modification of the third embodiment, the connection mode in each MTJ memory cell is different from that in the third embodiment.

Figure 21:
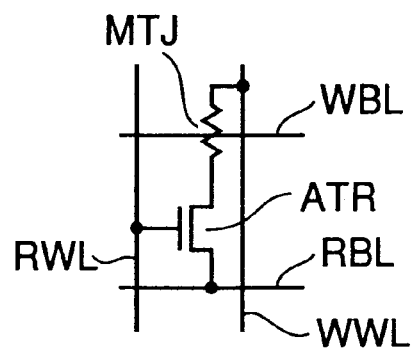
FIG. 21 is a circuit diagram showing the connection mode of an MTJ memory cell according to the modification of the third embodiment.

Referring to FIG. 21, an access transistor ATR is electrically connected between the read bit line RBL and a magnetic tunnel junction part MTJ in each MTJ memory cell according to the modification of the third embodiment. The magnetic tunnel junction part MTJ is connected between the access transistor ATR and the write word line WWL. The gate of the access transistor ATR is connected with the read word line RWL.

As described with reference to FIG. 17, the voltage of the write word line WWL is set to the ground voltage Vss in data reading, and hence the write word line WWL can be connected with the magnetic tunnel junction part MTJ in place of the write bit line WBL. Thus, the access transistor ATR is turned on in response to activation of the read word line RWL in data reading, so that a current path for a sense current Is can be formed through the read bit line RBL, the access transistor ATR, the magnetic tunnel junction part MTJ and the write word line WWL. Thus, a voltage change responsive to data stored in the magnetic tunnel junction part MTJ can be developed on the read bit line RBL.

In data writing, magnetic fields orthogonal to each other can be generated in the magnetic tunnel junction part MTJ by data write currents flowing through the write word line WWL and the write bit line WBL respectively.

Therefore, the data write operation and the data read operation for the MTJ memory cell according to the modification of the third embodiment can be executed by setting the voltages and currents of the read word line RWL, the write word line WWL, the read bit line RBL and the write bit line WBL similarly to those shown in FIG. 17 or 18.

Figure 22:
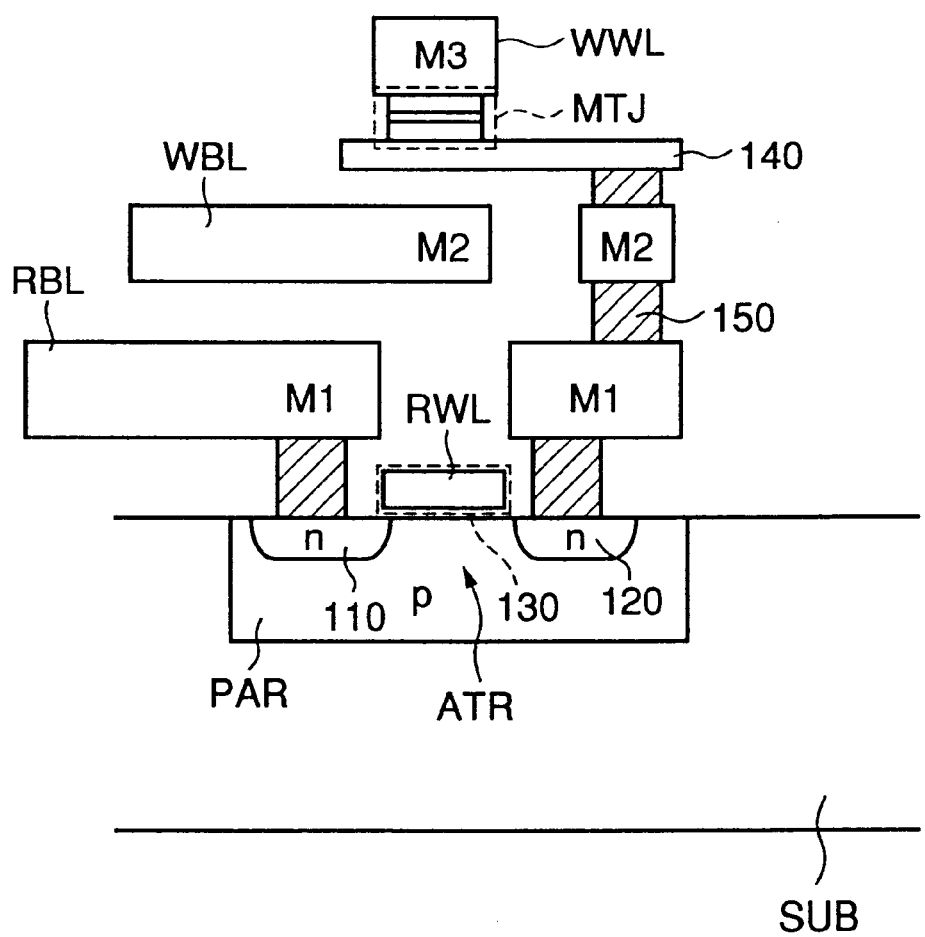
FIG. 22 is a structural diagram illustrating the arrangement of the MTJ memory cell according to the modification of the third embodiment.
Figure 23:
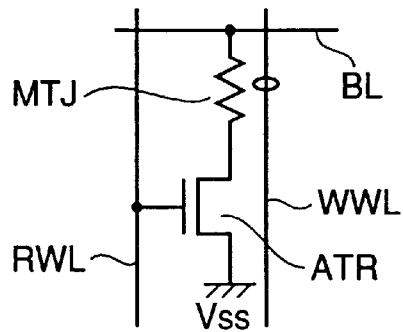
FIG. 23 is a schematic diagram showing the structure of a memory cell having a magnetic tunnel junction part.
Figure 24:
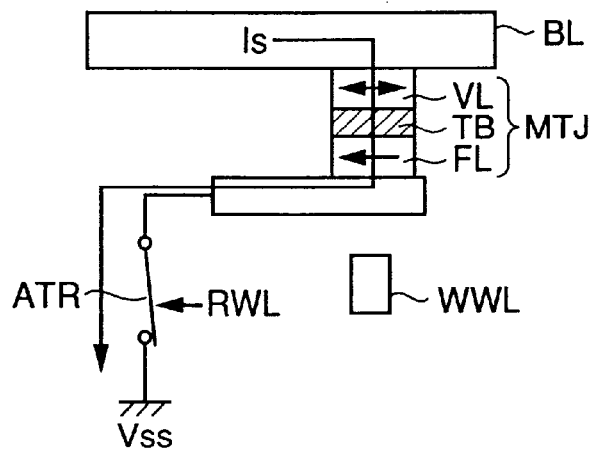
FIG. 24 is a conceptual diagram illustrating data read operation from the MTJ memory cell.
Figure 25:
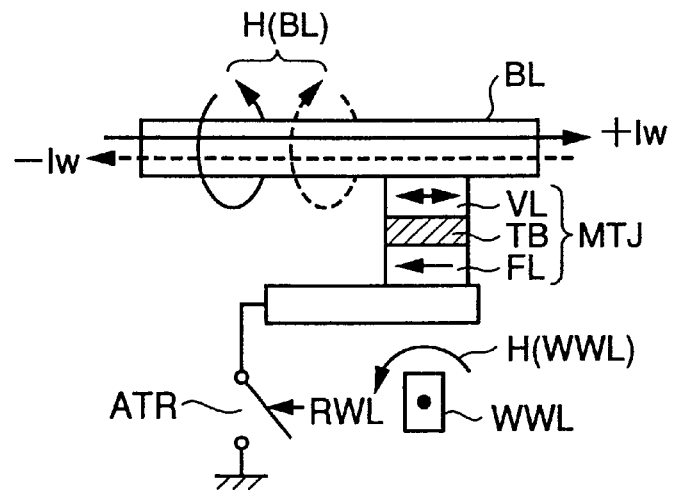
FIG. 25 is a conceptual diagram illustrating data write operation for the MTJ Memory cell.
Figure 26:
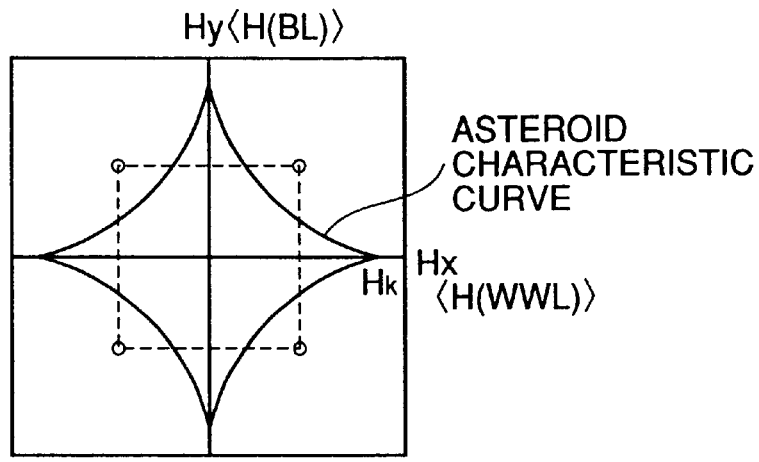
FIG. 26 is a conceptual diagram illustrating the relation between the directions of data write currents and field directions in data writing.
Figure 27:
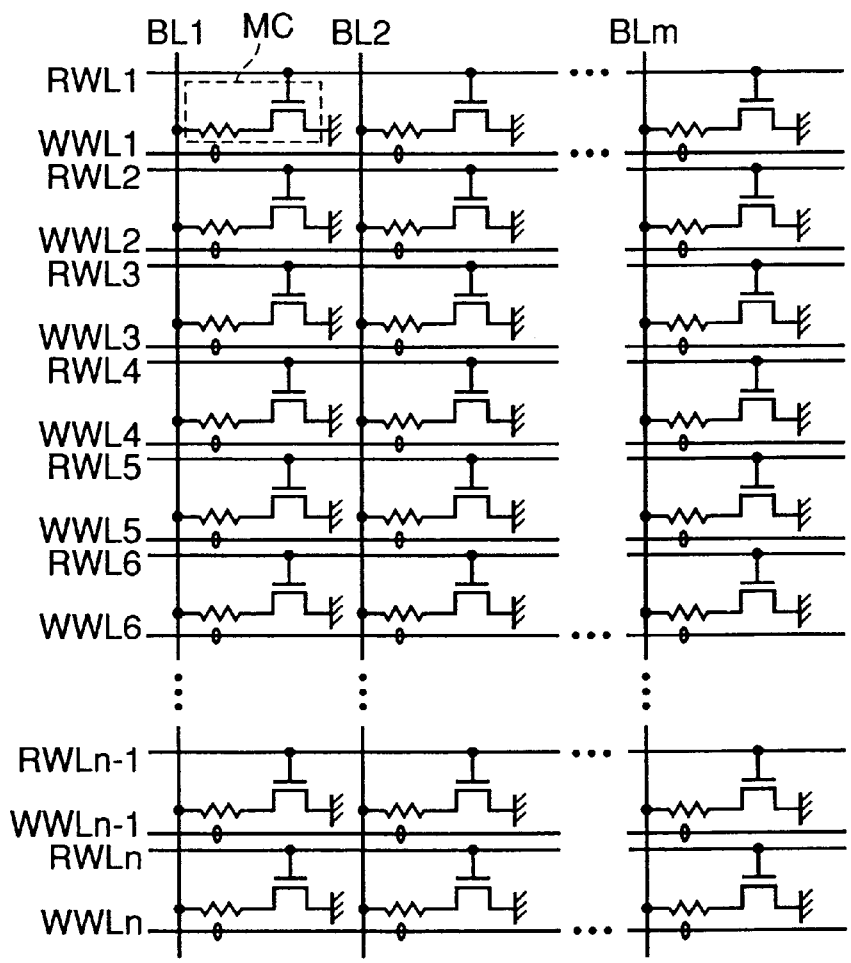
FIG. 27 is a conceptual diagram showing MTJ memory cells arranged in rows ad columns.
Figure 28:
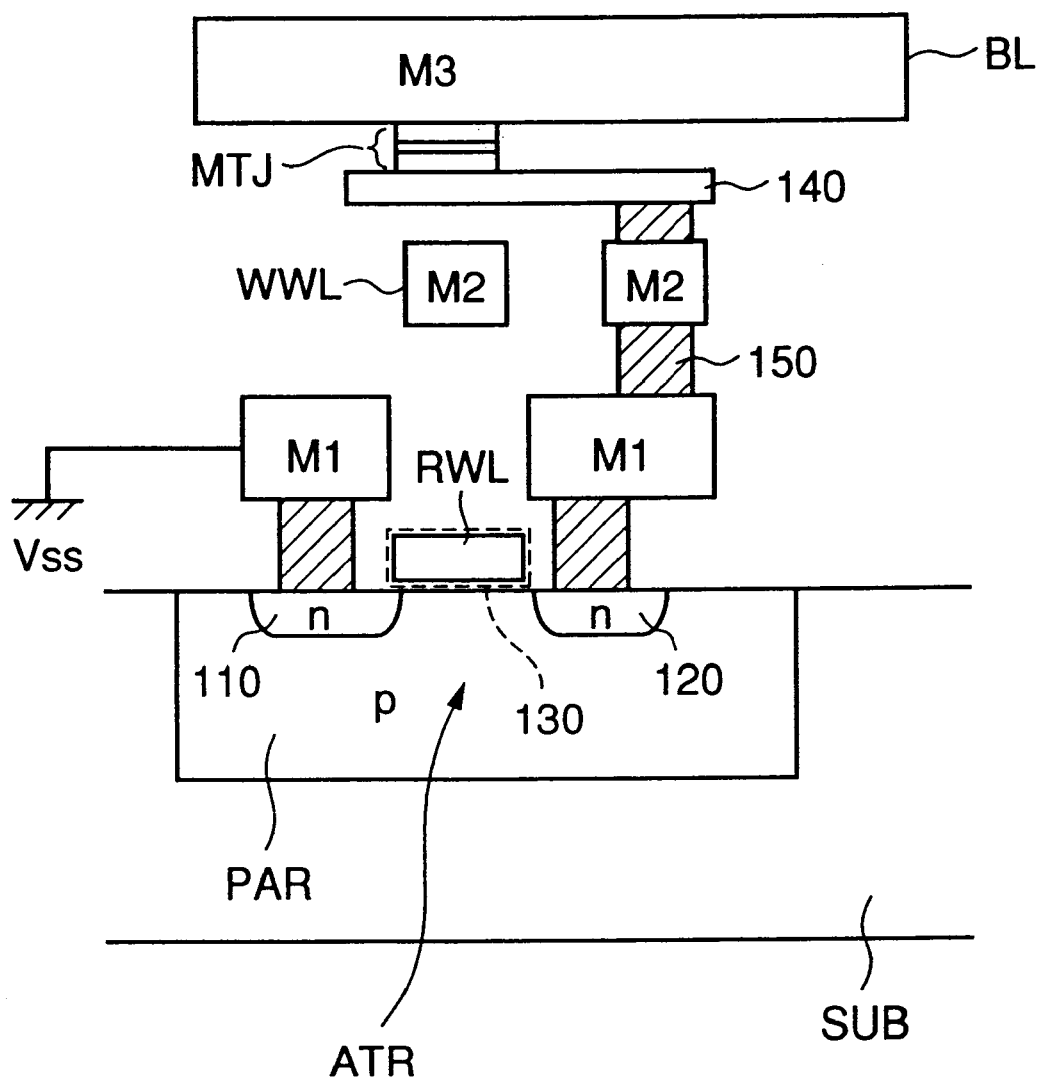
FIG. 28 is a structural diagram of the MTJ memory cell arranged on a semiconductor substrate.

Referring to FIG. 22, the write bit line WBL, which may not be connected with another wire or another MTJ memory cell in the modification of the third embodiment, can be freely arranged while giving priority to improvement of magnetic coupling with the magnetic tunnel junction part MTJ. The write bit line WBL is arranged immediately under the magnetic tunnel junction part MTJ through the second metal wiring layer M2 as shown in FIG. 19, for example.

The write word line WWL is electrically connected with the magnetic tunnel junction part MTJ and arranged on the third metal wiring layer M3. The arrangement of the read word line RWL, the access transistor ATR and the read bit line RBL is similar to that shown in FIG. 19, and hence redundant description is not repeated.

Thus, the read bit line RBL is connected with the magnetic tunnel junction part MTJ through the access transistor ATR, whereby the capacitance of the read bit line RBL can be suppressed without directly connecting the read bit line RBL with a number of magnetic tunnel junction parts MTJ belonging to the same memory cell column. Consequently, the data read operation can be performed at a high speed.

The space between the magnetic tunnel junction part MTJ and the write word line WWL can be reduced, whereby magnetic coupling in data writing can be increased so that the quantity of a data write current Ip for the write word line WWL can be set small. Magnetic noise can be further suppressed by suppressing the quantities of data write currents flowing through the write word line WWL and the write bit line WBL.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
    a memory array having a plurality of magnetic memory cells arranged in rows and columns, each of said plurality of magnetic memory cells including:
    a storage part having a resistance value varying with the level of stored data written when data write fields applied by first and second data write currents are larger than a prescribed magnetic field, and
    a memory cell selection gate for passing a data read current through said storage part in data reading;
    a plurality of write word lines provided in correspondence to said rows of said magnetic memory cells respectively and selectively activated in response to a result of row selection for feeding said first data write current in data writing;
    a plurality of read word lines provided in correspondence to said rows respectively for operating the corresponding memory cell selection gates in response to a result of row selection in said data reading;
    a plurality of reference lines for connecting each said storage part with a predetermined voltage; and
    a plurality of data lines provided in correspondence to said columns of said magnetic memory cells respectively for feeding said second data write current and said data read current in said data writing and said data reading respectively, wherein
    each of said plurality of data lines being electrically connected with the storage parts through said memory cell selection gates belonging to a corresponding one of said columns,
    said plurality of data lines being set to a first voltage before execution of said data reading.

2. The thin film magnetic memory device according to claim 1, wherein
    said plurality of reference lines are arranged along the same direction as said plurality of write word lines and said plurality of read word lines.

3. The thin film magnetic memory device according to claim 2, wherein
    said thin film magnetic memory device is formed on a semiconductor substrate, and said plurality of reference lines are formed on the same metal wiling layer as at least either said plurality of write word lines or said plurality of read word lines.

4. The thin film magnetic memory device according to claim 1, wherein
said plurality of reference lines are arranged along a direction intersecting with said plurality of write word lines and said plurality of read word lines.

5. A thin film magnetic memory device comprising:
a memory array having a plurality of magnetic memory cells arranged in rows and columns, each of said plurality of magnetic memory cells including:
a storage part having a resistance value varying with the level of stored data written when data write fields applied by first and second data write currents are larger than a prescribed magnetic field, and
a memory cell selection gate for passing a data read current through said storage part in data reading;
a plurality of write word lines provided in correspondence to said rows of said magnetic memory cells respectively and selectively activated in response to a result of row selection for feeding said first data write current in data writing;
a plurality of read word lines provided in correspondence to said rows respectively for operating the corresponding memory cell selection gates in response to a result of row selection in said data reading; and
a plurality of data lines provided in correspondence to said columns of said magnetic memory cells respectively for feeding said second data write current and said data read current in said data writing and said data reading respectively, wherein
each of said plurality of data lines is electrically connected with the storage parts through said memory cell selection gates in the magnetic memory cells belonging to a corresponding one of said columns,
said plurality of data lines are set to a first voltage before execution of said data reading,
said plurality of write word lines are inactivated and set to a second voltage different from said first voltage in said data reading, and
each said storage part is electrically connected between the corresponding memory cell selection gate and a corresponding one of said plurality of write word lines.

6. A thin film magnetic memory device comprising:
a memory array having a plurality of magnetic memory cells arranged in rows and columns, each of said plurality of magnetic memory cells including:
a storage part having a resistance value varying with the level of stored data written when data write fields applied by first and second data write currents are larger than a prescribed magnetic field, and
a memory cell selection gate for passing a data read current through said storage part in data reading;
a plurality of write word lines provided in correspondence to said rows of said magnetic memory cells respectively and selectively activated in response to a result of row selection for feeding said first data write current in data writing, each of said plurality of write word lines being electrically connected with said storage parts through said memory cell selection gates in the magnetic memory cells belonging to a corresponding one of said columns, and inactivated and set to a prescribed voltage in said data reading;
a plurality of read word lines provided in correspondence to said rows respectively for operating corresponding said memory cell selection gates in response to a result of row selection in said data reading; and
a plurality of data lines provided in correspondence to said columns of said magnetic memory cells respectively for feeding said second data write current and said data read current in said data writing and said data reading respectively, wherein
the voltage levels of said plurality of data lines are set to a voltage different from said prescribed voltage before execution of said data reading.

7. The thin film magnetic memory device according to claim 7, wherein
said thin film magnetic memory device is formed on a semiconductor substrate along with a plurality of metal wiring layers, and
said plurality of data lines are arranged on one of said plurality of metal wiring layers formed upward beyond another one of said plurality of metal wiring layers on which said plurality of write word lines are arranged.

8. A thin film magnetic memory device comprising:
a memory array having a plurality of magnetic memory cells arranged in rows and columns, each of said plurality of magnetic memory cells including:
a storage part having a resistance value varying with the level of stored data written when data write fields applied by first and second data write currents are larger than a prescribed magnetic field, and
a memory cell selection gate for passing a data read current through said storage part in data reading;
a plurality of write word lines provided in correspondence to said rows of said magnetic memory cells respectively and selectively activated in response to a result of row selection for feeding said first data write current in data writing;
a plurality of read word lines provided in correspondence to said rows respectively for operating corresponding said memory cell selection gates in response to a result of row selection in said data reading;
a plurality of write data lines provided in correspondence to said columns of said magnetic memory cells respectively for feeding said second data write current in said data writing; and
a plurality of read data lines provided in correspondence to said columns respectively for feeding said data read current in said data reading, wherein
each of said plurality of read data lines is electrically connected with each of the storage parts belonging to a corresponding one of said columns through said memory cell selection gate.

9. The thin film magnetic memory device according to claim 9, wherein
said plurality of read data lines are set to a first voltage before execution of said data reading,
said plurality of write data lines are set to a second voltage different from said first voltage in said data reading, and
each said storage part is electrically connected between the corresponding memory cell selection gate and a corresponding one of said plurality of write data lines.

10. The thin film magnetic memory device according to claim 10, wherein
said plurality of read data lines are set to said first voltage in operation other than said data reading.

11. The thin film magnetic memory device according to claim 10, wherein said plurality of write data lines are set to said second voltage in operation other than said data writing.

12. The thin film magnetic memory device according to claim 9, wherein said plurality of read data lines are set to a first voltage before execution of said data reading, said plurality of write word lines are set to a second voltage different from said first voltage in said data reading, and each said storage part is electrically connected between the corresponding memory cell selection gate and a corresponding one of said plurality of write word lines.

13. The thin film magnetic memory device according to claim 12, wherein said plurality of read data lines are set to said first voltage in operation other than said data reading.

14. The thin film magnetic memory device according to claim 13, wherein said plurality of write data lines are set to said second voltage in operation other than said data writing.

15. The thin film magnetic memory device according to claim 9, wherein said thin film magnetic memory device is formed on a semiconductor substrate along with a plurality of metal wiring layers, and said plurality of write data lines are arranged on one of said plurality of metal wiring layers at a smaller distance from said storage part than another one of said plurality of metal wiring layers on which said plurality of read data lines are arranged.

16. The thin film magnetic memory device according to claim 1, wherein said predetermined voltage corresponds to the ground voltage.

17. A thin film magnetic memory device comprising:

a memory array having a plurality of magnetic memory cells arranged in rows and columns;

a plurality of write word lines provided in correspondence to said rows of said magnetic memory cells respectively and selectively activated in response to a result of row selection for feeding a first data write current in data writing;

a word line driver for selectively connecting one end of at least activated one of said plurality of write word lines to a first voltage according to said result of row selection in said data writing;

a plurality of data lines provided in correspondence to said columns of said magnetic memory cells respectively for feeding a second data write current and a data read current in said data writing and data reading respectively, and a plurality of read word lines provided in correspondence to said rows respectively selectively activated in response to said result of row selection in said data reading for connecting the corresponding memory cells between a corresponding one of said write word lines and said plurality of data lines, respectively;

wherein the other end of each of said plurality of write word lines is fixed to a second voltage different from said first voltage.

* * * * *